United States Patent [19]

Merchant et al.

[11] Patent Number: 5,347,489
[45] Date of Patent: Sep. 13, 1994

[54] METHOD AND CIRCUITRY FOR PRECONDITIONING SHORTED ROWS IN A NONVOLATILE SEMICONDUCTOR MEMORY INCORPORATING ROW REDUNDANCY

[75] Inventors: Amit Merchant, Citrus Heights; Mickey L. Fandrich, Placerville; Neal Mielke, Los Altos Hills, all of Calif.

[73] Assignee: Intel Corporation, Santa Clara, Calif.

[21] Appl. No.: 871,848

[22] Filed: Apr. 21, 1992

[51] Int. Cl.$^5$ ............................................. G11C 11/40
[52] U.S. Cl. .................................. 365/203; 365/210; 365/900; 365/200; 365/230.06; 365/218; 371/10.3
[58] Field of Search ............... 365/203, 900, 218, 210, 365/200, 230.06; 371/10.3

[56] References Cited

U.S. PATENT DOCUMENTS

| | | | |
|---|---|---|---|
| 4,538,245 | 8/1985 | Smarandoiu et al. | 365/210 |
| 4,943,948 | 7/1990 | Morton et al. | 365/201 |
| 5,053,990 | 10/1991 | Kreifels et al. | 364/900 |
| 5,124,945 | 6/1992 | Schreck | 365/185 |
| 5,132,935 | 7/1992 | Ashmore, Jr. | 365/185 |
| 5,134,583 | 7/1992 | Matsuo et al. | 365/200 |
| 5,222,046 | 6/1993 | Kreifels et al. | 365/230.06 |
| 5,233,559 | 8/1993 | Brennan, Jr. | 365/203 |
| 5,237,535 | 8/1993 | Mielke et al. | 365/218 |

FOREIGN PATENT DOCUMENTS

5011289A2 2/1992 European Pat. Off. ...... G11C 16/06

*Primary Examiner*—Viet Q. Nguyen
*Attorney, Agent, or Firm*—Blakely, Sokoloff, Taylor & Zafman

[57] ABSTRACT

A method of preconditioning and verifying the preconditioning of memory cells within shorted rows of a memory array is described. Preconditioning begins by applying a preconditioning pulse to two memory cells that are shorted together. Afterward, one of the two shorted cells is read by applying a nominal gate voltage level to the gates of both of the shorted memory cells. At the same time, a shorted reference cell is read by applying a voltage level to its gate which less than the nominal gate voltage level. While the read voltages are being applied to the array cells and the shorted reference cell, the threshold voltage of one of the two shorted array cells is compared to the threshold voltage of the shorted reference cell. The shorted reference cell has a threshold voltage level that is lower than the level normally required for preconditioning but which is sufficient to prevent the quick overerasure of the shorted memory cells.

3 Claims, 24 Drawing Sheets

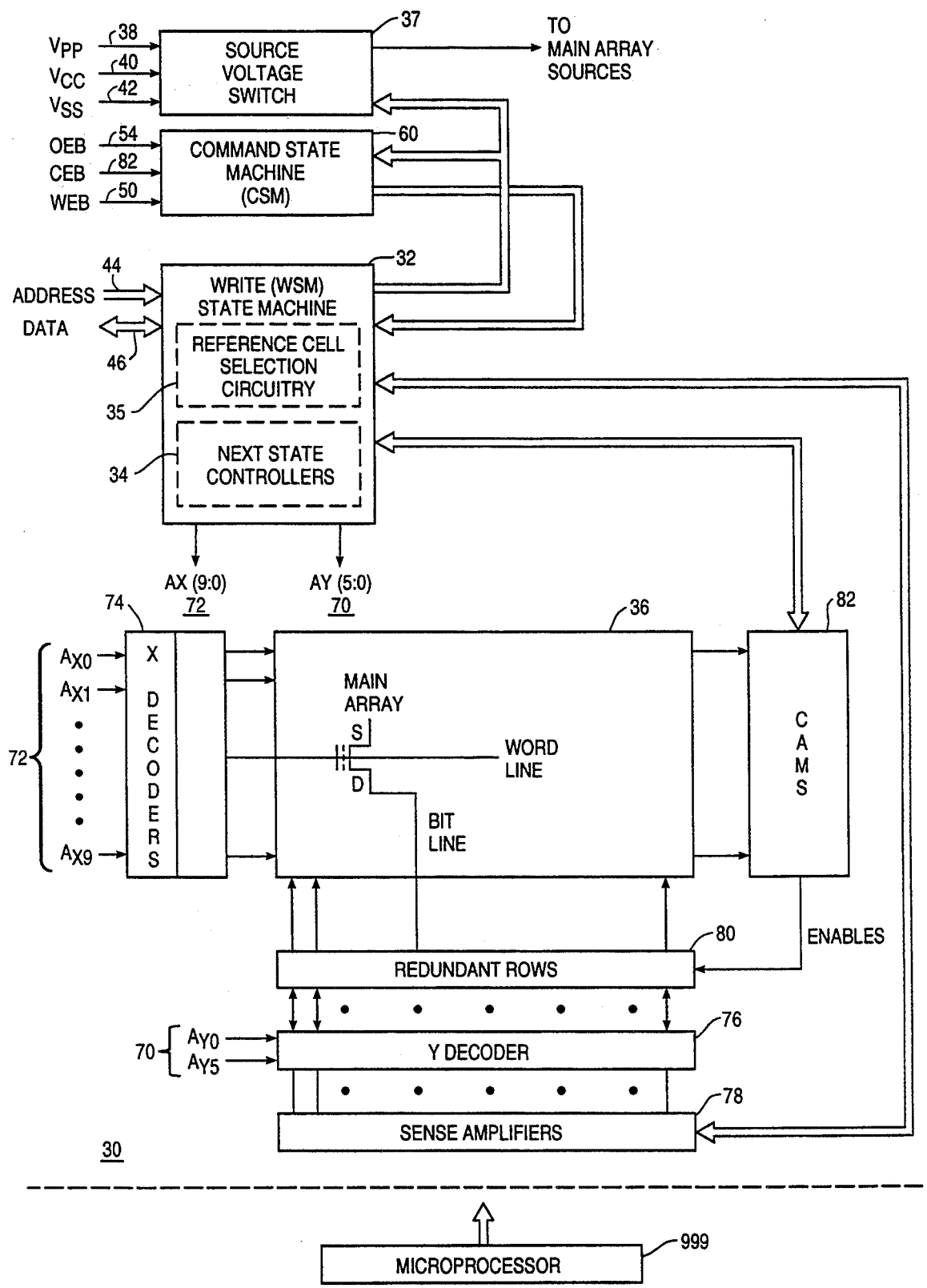

FIG._2

| | BUS CYCLES REQUIRED | FIRST BUS CYCLE | | | SECOND BUS CYCLE | | |
|---|---|---|---|---|---|---|---|
| | | OPERATION | ADDRESS | DATA | OPERATION | ADDRESS | DATA |
| READ ARRAY | 1 | WRITE | X | FFH | | | |
| READ STATUS REGISTER | 2 | WRITE | X | 70H | READ | X | SRD |
| CLEAR STATUS REGISTER | 1 | WRITE | X | 50H | | | |
| ERASE SETUP/ERASE CONFIRM | 2 | WRITE | X | 20H | WRITE | X | D0H |
| PROGRAM SETUP/PROGRAM | 2 | WRITE | X | 40H | WRITE | PA | PD |

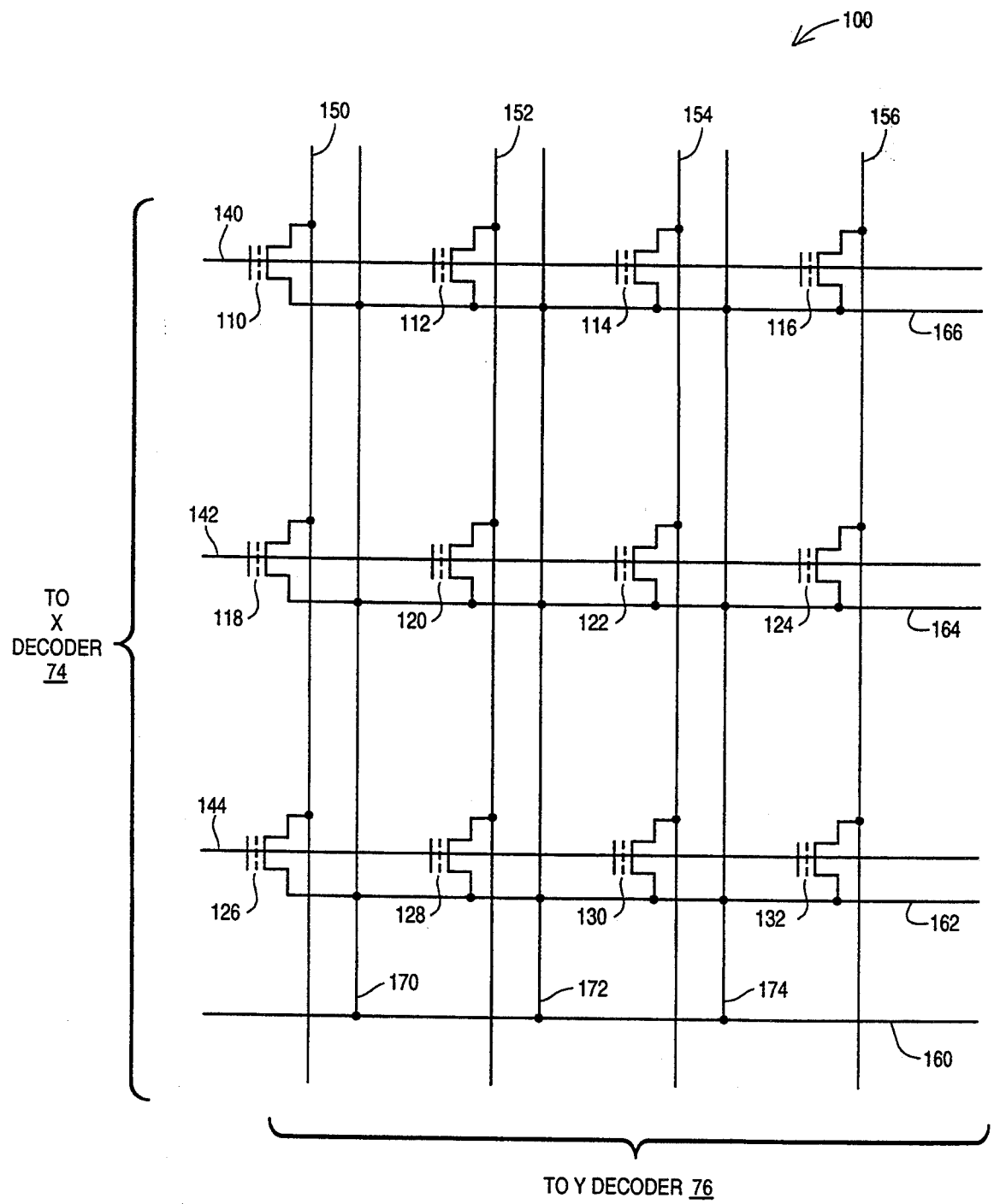
FIG_3

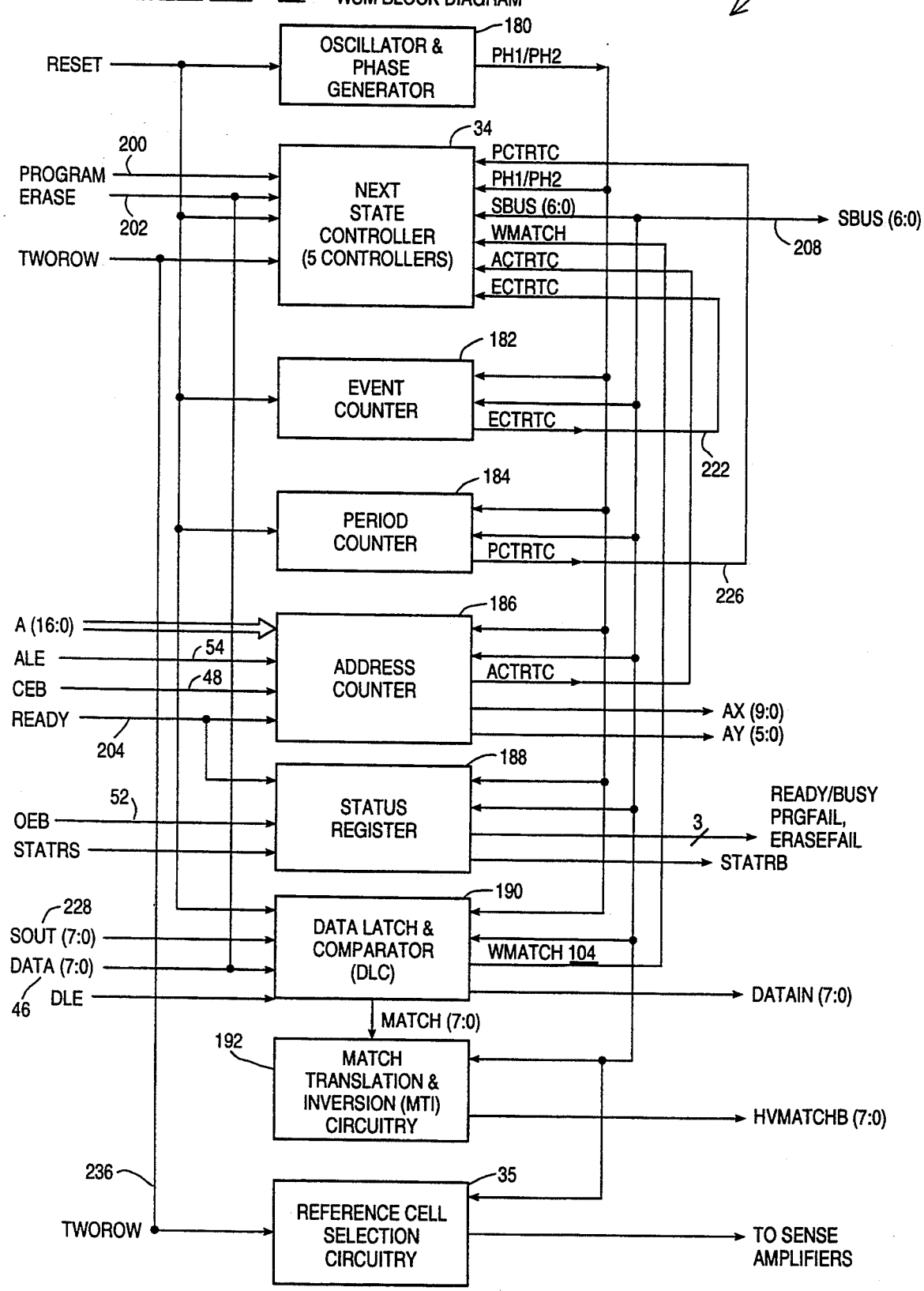

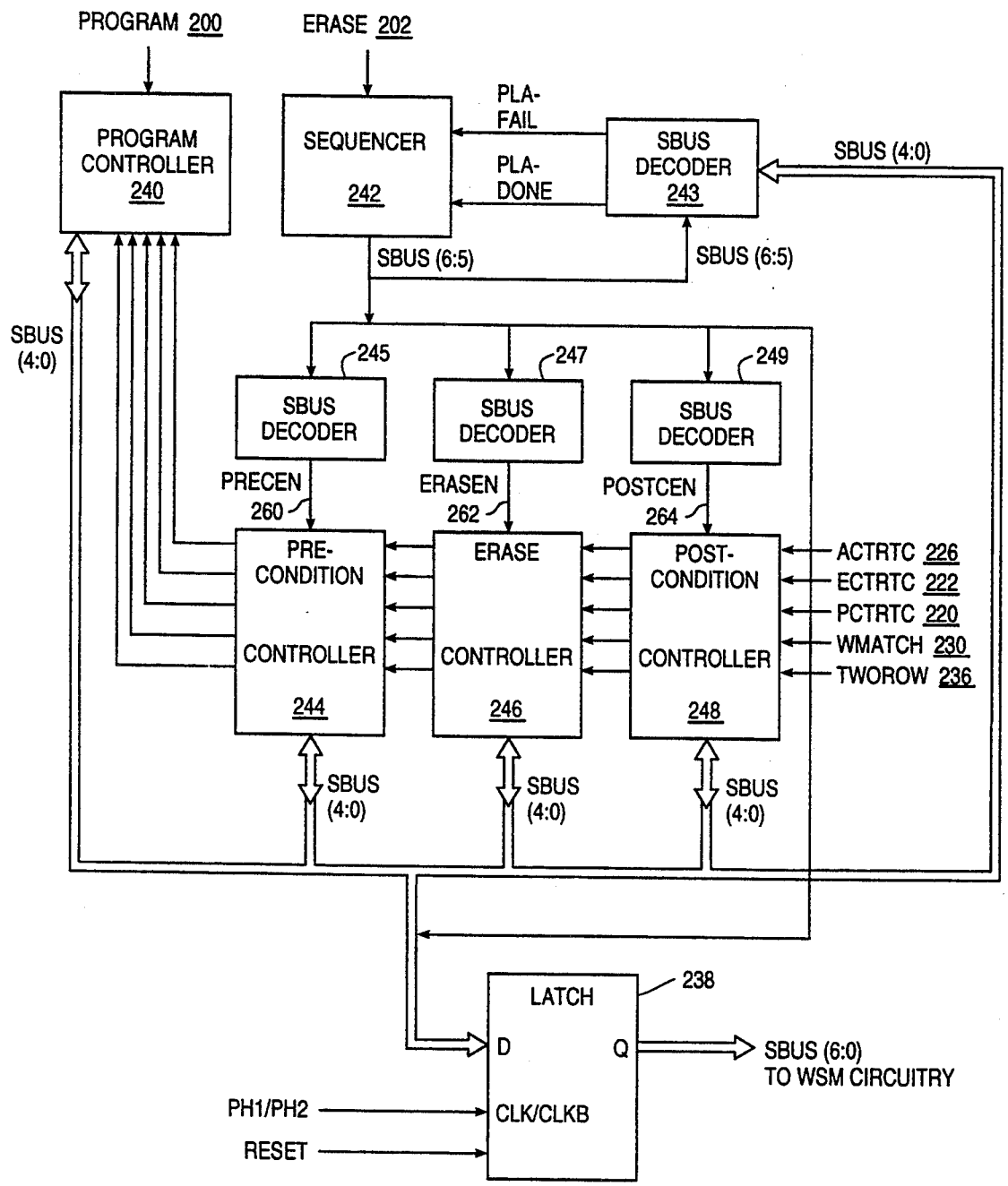
FIG_5

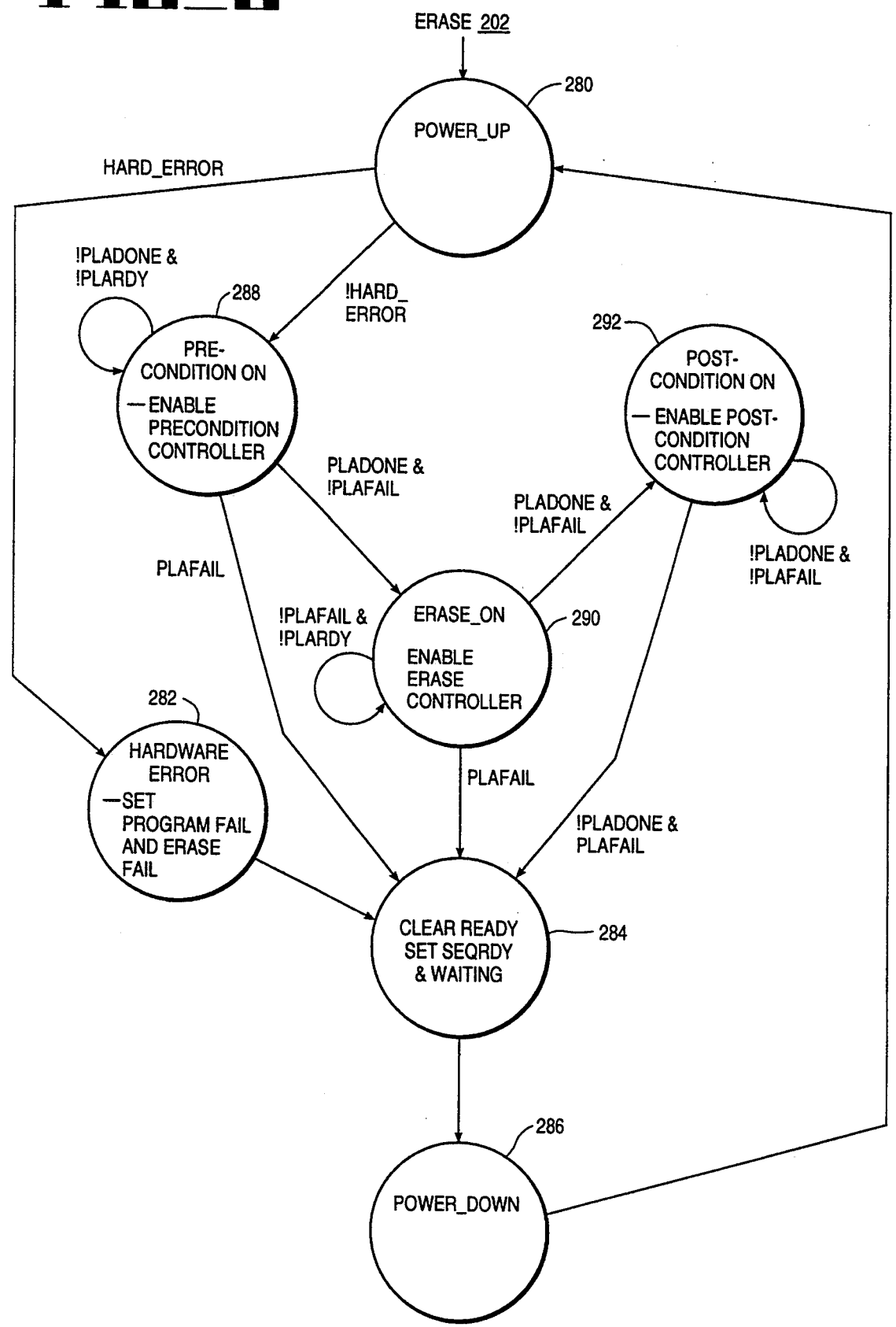
FIG_6

FIG_7

| SIGNAL ACRONYM | MEANING |
|---|---|
| PCTRVSI | SELECTS THE PERIOD COUNTER TERMINAL COUNT FOR VSI RISE TIME. |
| PCTRPGM | SELECTS THE PERIOD COUNTER TERMINAL COUNT FOR PROGRAM PULSE WIDTH. |
| PCTRPGV | SELECTS THE PERIOD COUNTER TERMINAL COUNT FOR PROGRAM VERIFY DELAY. |
| PCTRERS | SELECTS THE PERIOD COUNTER TERMINAL COUNT FOR ERASE PULSE WIDTH. |
| PCTRERV | SELECTS THE PERIOD COUNTER TERMINAL COUNT FOR ERASE VERIFY DELAY. |
| PCPREV | SELECTS THE PERIOD COUNTER TERMINAL COUNT FOR PRECONDITION VERIFY DELAY. |
| PCTRRST | PERIOD COUNTER RESET. |
| MTIEN | ENABLE MTI CIRCUITRY. |
| AE | ARRAY ENABLE. |
| DATEN | DATA PATH ENABLE. |
| COMPEN | COMPARATOR ENABLE. |
| COMPERS | MUXES 00h OR FFh FOR PreCONDITION, ERASE OR VERIFY. |
| REFDAT | DATA FOR PREC, ERASE, i.e. 0 OR 1. |
| ECTREN | ENABLE EVENT COUNTER. |
| ECTRPGM | SELECTS THE EVENT COUNTER TERMINAL COUNT FOR MAXIMUM PROGRAM PULSES. |
| ECERS | SELECTS THE EVENT COUNTER TERMINAL COUNT FOR MAXIMUM ERASE PULSES. |
| ECTRRST | RESETS EVENT COUNTER. |
| EXTRABIT | ENABLES REDBIT IN ADDRESS COUNTER. |
| ACTREN | ADDRESS COUNTER ENABLE. |
| ACTRRST | ADDRESS COUNTER RESET. |
| PGMFAIL | SET PROGRAM FAIL BIT. |
| ERAFAI | SET ERASE FAIL BIT. |
| PLADONE | PRECONDITION/ERASE/DONE SUCCESSFULLY. |
| PLAFAIL | PRECONDITION/ERASE/FAILS. |
| CLRRDY | CLEAR READY/BUSY B SIGNAL FROM PROGRAM ALGORITHM. |
| NOSWAP | STATES IN PreC IN WHICH SWAPPING OF SHORTED ROWS BY REDUNDANT ROWS IS DISALLOWED. |
| CMPRST | RESETS THE COMPARATOR DURING PRECONDITION FOR THE FIRST PULSE OF PRECONDITIONING PULSE. |

FIG_8

SEQUENCER ALGORITHM

| SBUS (6:5) | SEQRDY | HARDERROR | WAITING | RERASE | ERASEEN | POSTEC EN | STATE NAME |
|---|---|---|---|---|---|---|---|
| 00 | 0 | 0 | 1 | 0 | 0 | 0 | POWER-UP |
| 01 | 0 | 0 | 0 | 1 | 0 | 0 | PRECONDITION ON |
| 10 | 0 | 0 | 0 | 0 | 1 | 0 | ERASE ON |
| 11 | 0 | 0 | 0 | 0 | 0 | 1 | POSTCONDITION ON |
| 00 | 1 | 0 | 1 | 0 | 0 | 0 | CLEAR READY |
| 00 | 1 | 0 | 1 | 0 | 0 | 0 | POWER DOWN |

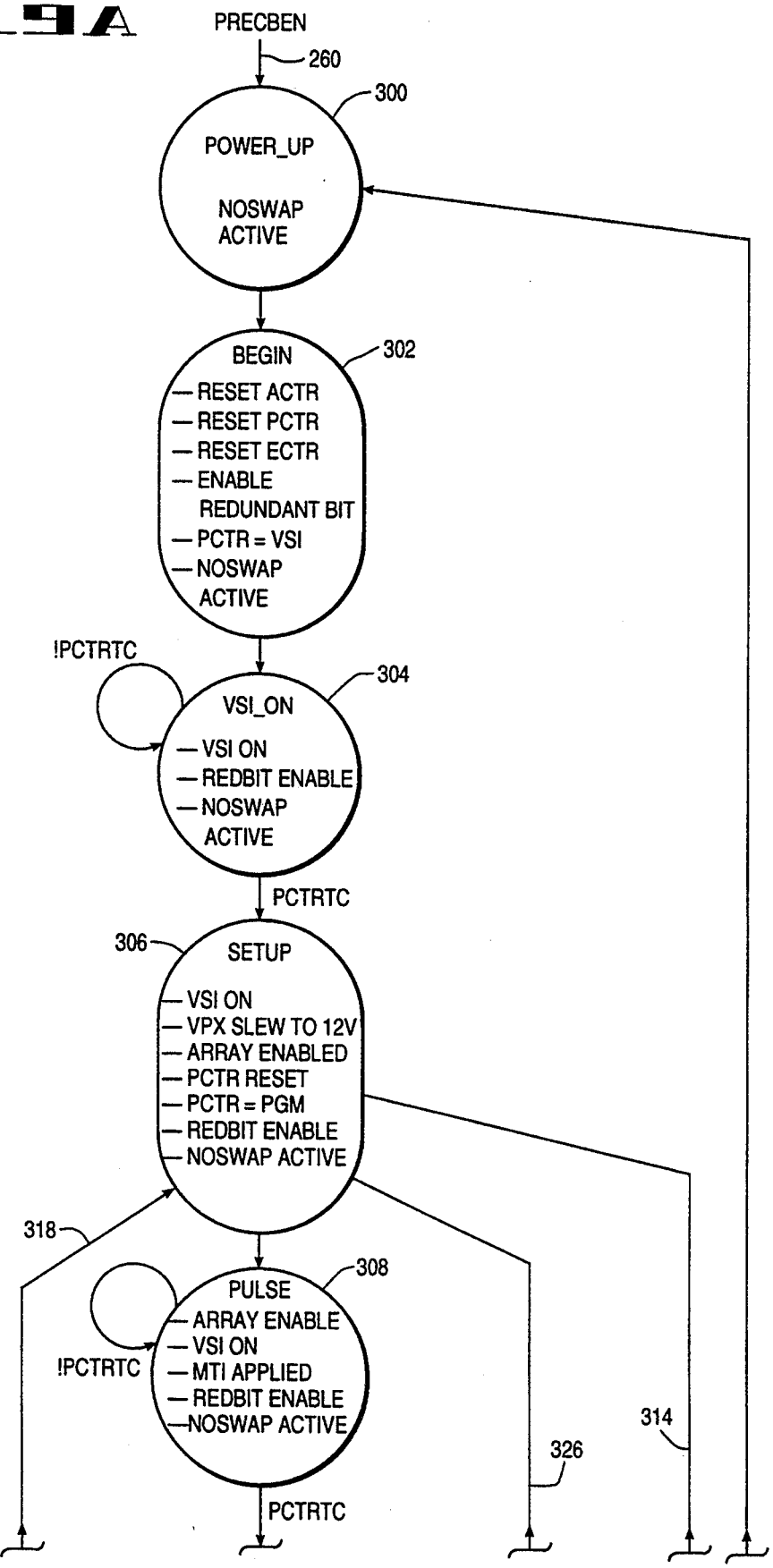

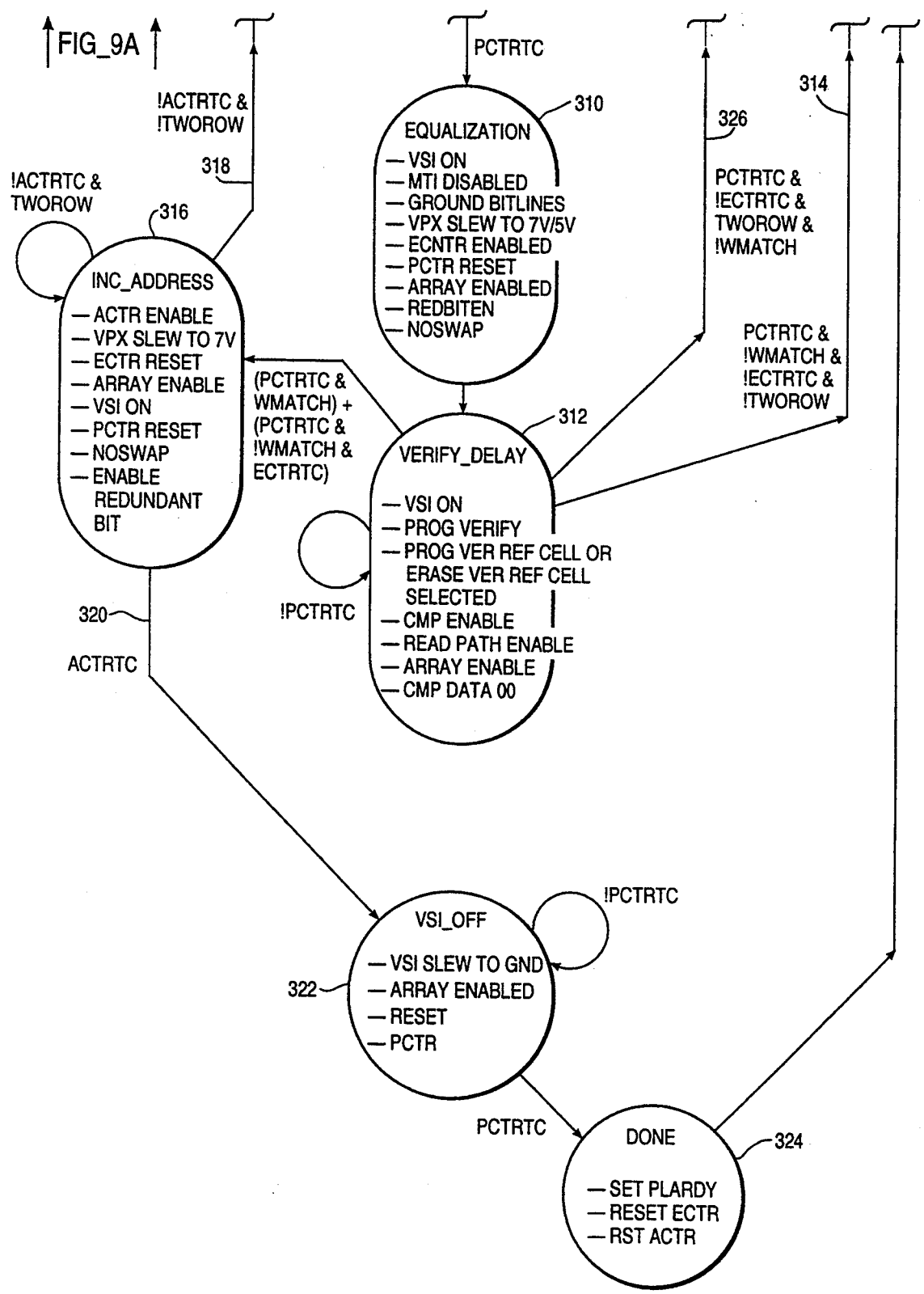
FIG_9B

FIG_10

PERCONDITIONING ALGORITHM

| SBUS (6:0) | SIGNAL VALUE | STATE NAME |
|---|---|---|
| | ECTRRST / PCCTRRSST / APTTRRSVT / VSIROWN / NOSDBAIT / RETTRAMPE / AMETCCOTTMRE / MPERRPPNS / PCCCOTTMRRPPRGN / ACCOETTTMRRPPRS / EPCOMTTMRRRGM / PCCOEFFMRRPPAT / CRPDFDPAL / PLAAAAOTN / PLALDOTNLE | |
| 0100000 | - 1 - 0 - 1 0 0 0 0 0 0 1 0 0 | POWER-UP |
| 0101011 | 1 0 1 0 0 0 0 0 0 0 0 1 0 0 | BEGIN |
| 0101001 | 0 0 0 0 0 1 1 1 0 0 1 1 1 0 0 | VSI ON |
| 0100110 | 0 1 0 0 0 1 1 1 0 1 0 1 0 1 0 | SET-UP |
| 0100111 | 0 0 0 0 1 1 1 1 1 0 1 0 1 0 0 | PULSE |
| 0100101 | 0 1 0 0 0 1 1 1 0 1 0 1 0 1 0 | EQUALIZATION |
| 0101000 | 0 0 0 0 0 1 1 1 1 0 0 1 0 1 0 | VERIFY DELAY |
| 0101000 | 1 1 1 1 1 1 1 1 0 1 1 0 0 1 0 | INC ADD |
| 0101010 | 0 0 0 0 1 1 0 0 0 0 0 1 0 1 0 | VSI OFF |
| 0100010 | 1 1 1 1 1 1 0 0 0 0 0 1 0 0 1 | DONE |

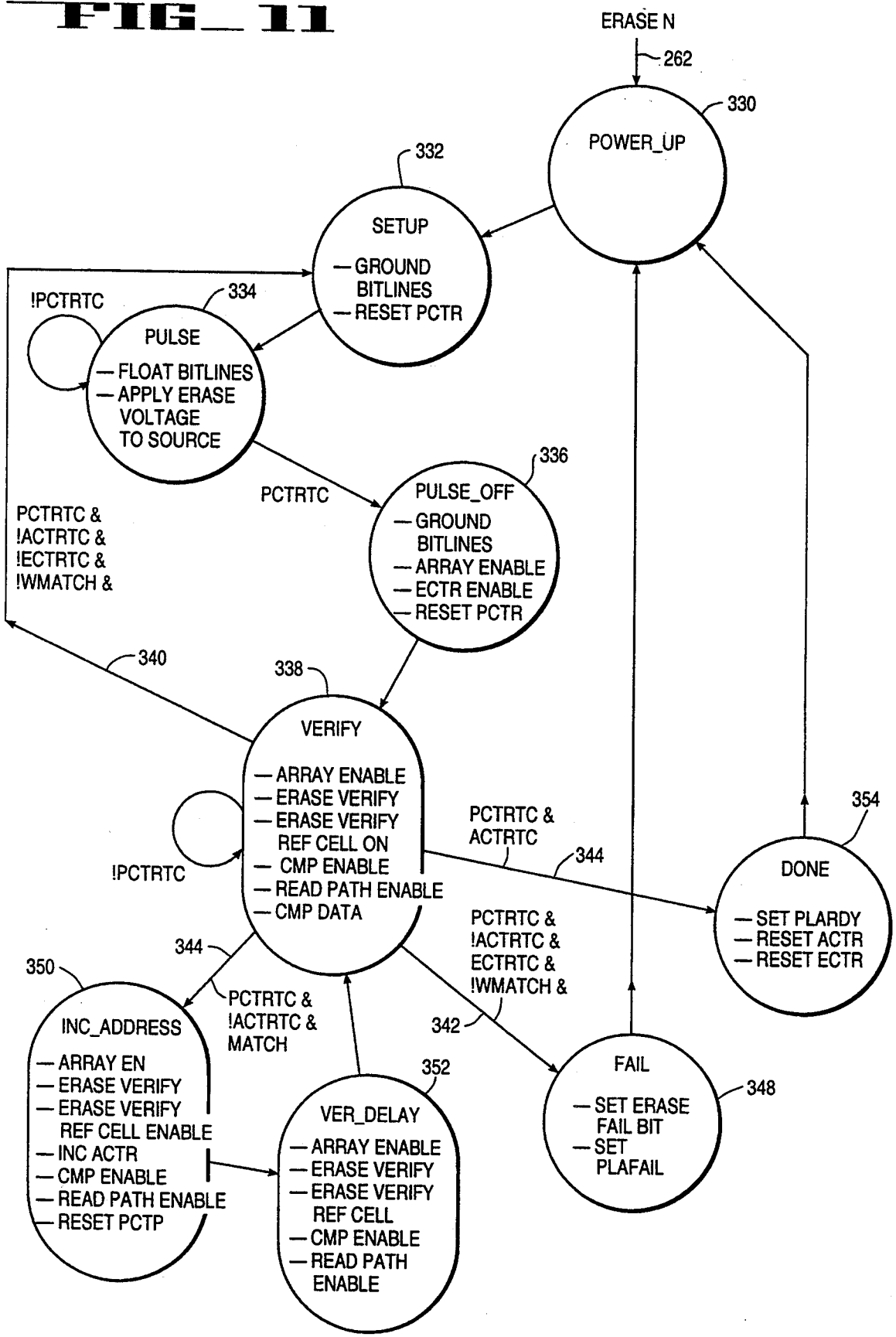

FIG_12

ERASE ALGORITHM

| SBUS (6:0) | \[S1\] | \[S2\] | \[S3\] | \[S4\] | \[S5\] | \[S6\] | \[S7\] | \[S8\] | \[S9\] | \[S10\] | \[S11\] | \[S12\] | \[S13\] | STATE NAME |
|---|---|---|---|---|---|---|---|---|---|---|---|---|---|---|
| 1000000 | 0 | 0 | 0 | 0 | 0 | 0 | 0 | 0 | 0 | 0 | 0 | 0 | 1 | POWER-UP |
| 1000011 | 0 | 0 | 0 | 0 | 1 | 0 | 0 | 0 | 0 | 0 | 0 | 0 | 1 | SET-UP |
| 1001001 | 0 | 0 | 0 | 1 | 0 | 1 | 0 | 0 | 0 | 1 | 0 | 0 | 0 | PULSE |
| 1000100 | 1 | 0 | 1 | 1 | 1 | 1 | 0 | 0 | 0 | 0 | 1 | 0 | 1 | PULSE OFF |
| 1000110 | 1 | 1 | 0 | 1 | 1 | 0 | 1 | 0 | 0 | 0 | 0 | 0 | 0 | VERIFY |
| 1000111 | 1 | 1 | 1 | 1 | 1 | 0 | 1 | 0 | 1 | 0 | 0 | 1 | 0 | INC ADD |
| 1001000 | 0 | 1 | 0 | 1 | 0 | 1 | 1 | 1 | 0 | 0 | 0 | 0 | 0 | VERIFY DELAY |
| 1001010 | 0 | 0 | 0 | 0 | 0 | 0 | 0 | 1 | 0 | 1 | 0 | 0 | 0 | FAIL |
| 1000010 | 0 | 0 | 0 | 0 | 0 | 1 | 1 | 0 | 1 | 0 | 0 | 0 | 1 | DONE |

Signal value columns (S1–S13) correspond to control signals labeled vertically in the original figure (AERASE, ECOMMAND, CCPROTECT, ATMFAST, RPPRDDATA, PPRDFDATA, EEARRARR, NSRORE, PCLOMT, ELRTLSSS, PCCRTRRE, PCTRERS, TRRSVT).

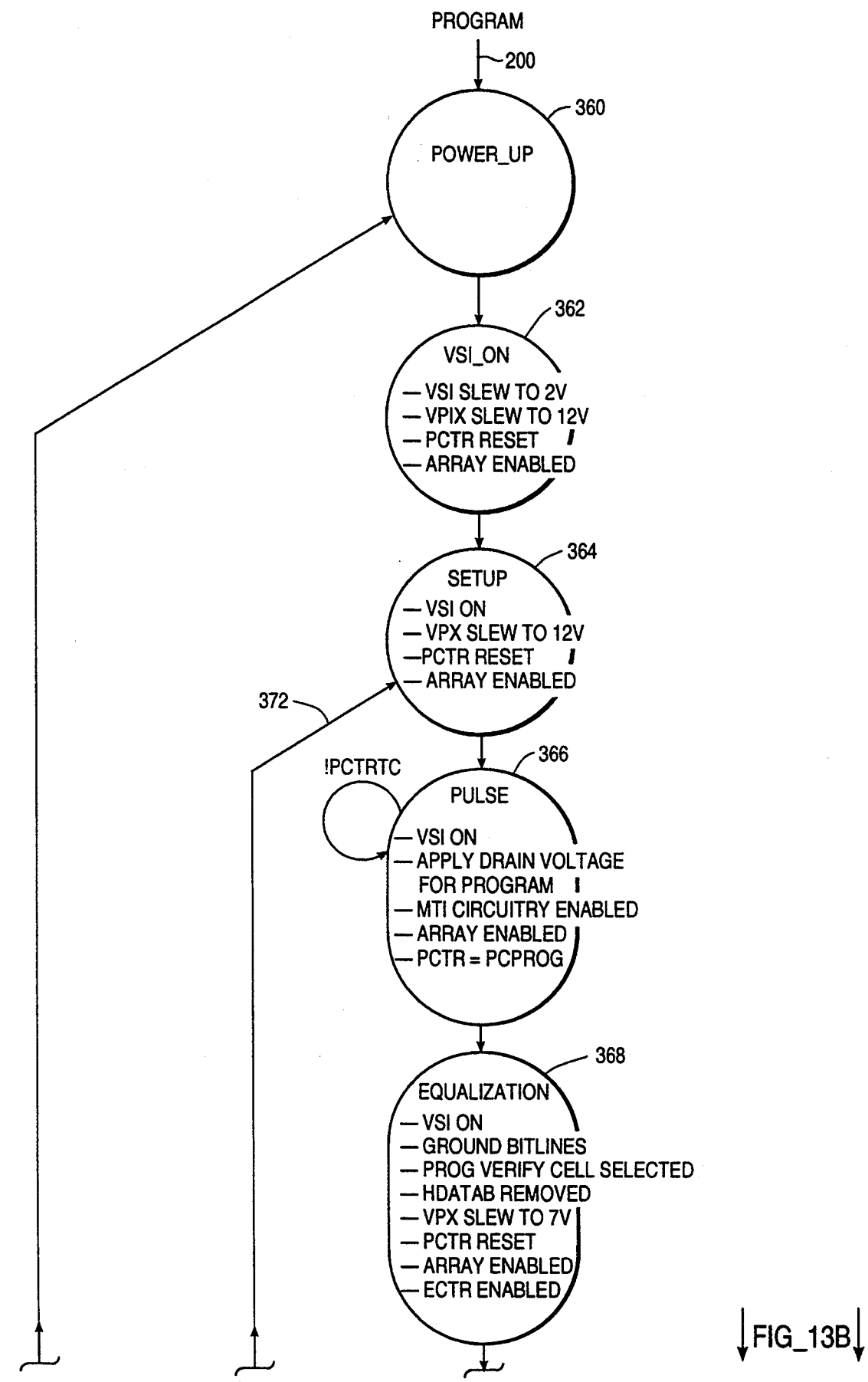
FIG_13A

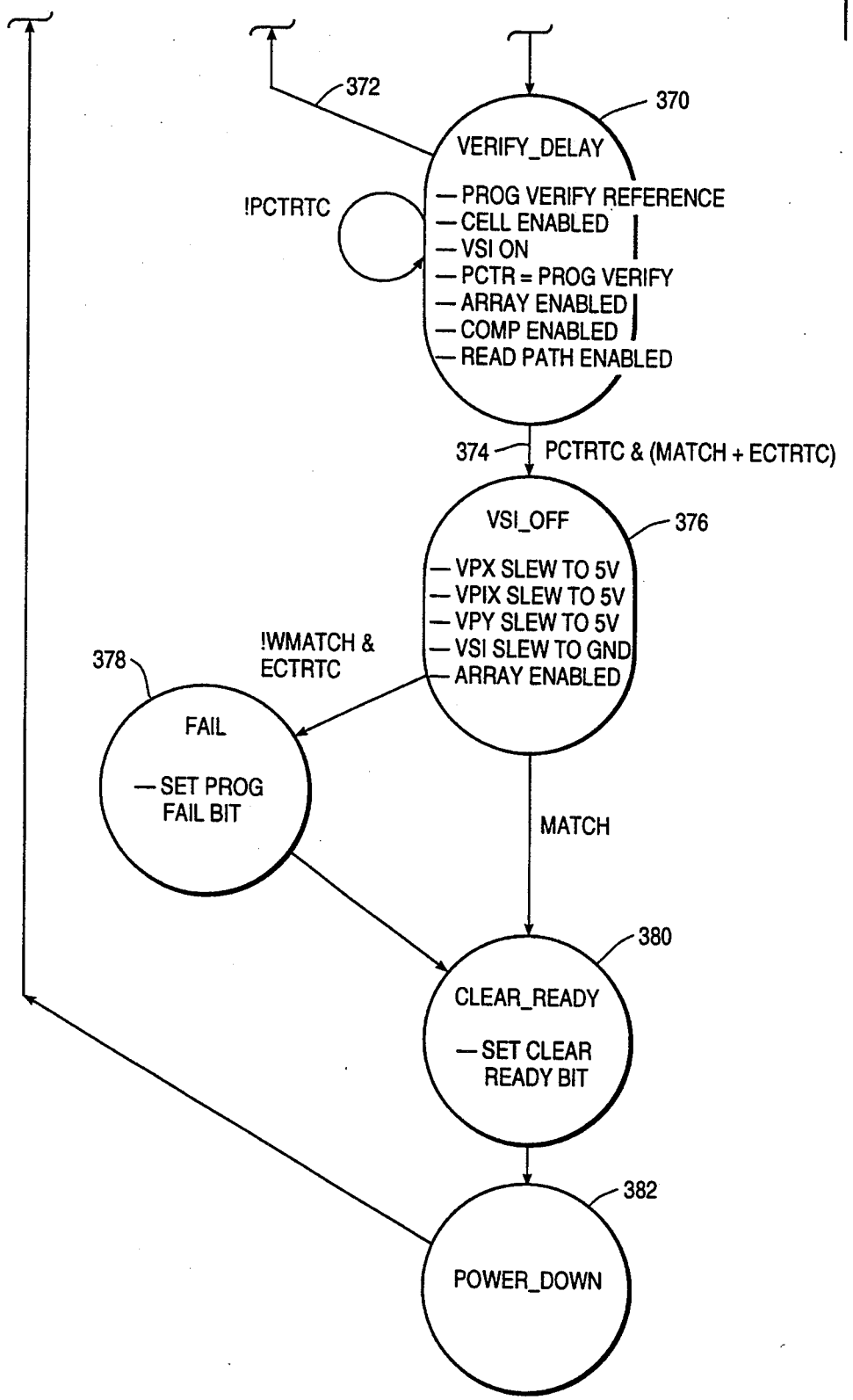

FIG. 14

PROGRAM ALGORITHM

| SBUS (6:0) | SIGNAL ACRONYM VALUE | STATE NAME |
|---|---|---|
| | AMP_ENT / ETC_CNT / PC_COC_TM / PE_CC_MT / EC_CR_TF / EC_CO_TM / CO_OT_MT / PE_EE_PP / RG_GR_AR / PC_GR_AR / AE_CC_RS / EC_CT_ST / PL_LT_TR / CE_E_RD_Y | |
| 0000000 | 0 0 0 0 0 0 0 X 0 0 0 1 0 | POWER-UP |
| 0000111 | 1 0 0 1 0 0 0 X 0 0 0 0 0 | VSI ON |
| 0000101 | 1 0 0 0 0 1 0 X 0 0 1 0 0 | SET-UP |
| 0001000 | 1 1 1 0 0 0 0 X 0 0 0 0 0 | PULSE |
| 0000100 | 1 0 0 1 0 0 0 X 0 0 0 1 0 | EQUALIZATION |
| 0000110 | 1 0 1 0 1 0 1 1 X 0 0 0 0 | VERIFY DELAY |
| 0000011 | 0 0 0 0 0 0 0 X 1 0 0 0 0 | VSI OFF |
| 0000010 | 0 0 0 0 0 0 0 X 0 1 0 0 0 | FAIL |
| 0000001 | 0 0 0 0 0 0 0 X 0 0 1 0 1 | CLEAR READY |
| 0001001 | 0 0 0 0 0 0 0 X 0 0 0 1 1 | POWER DOWN |

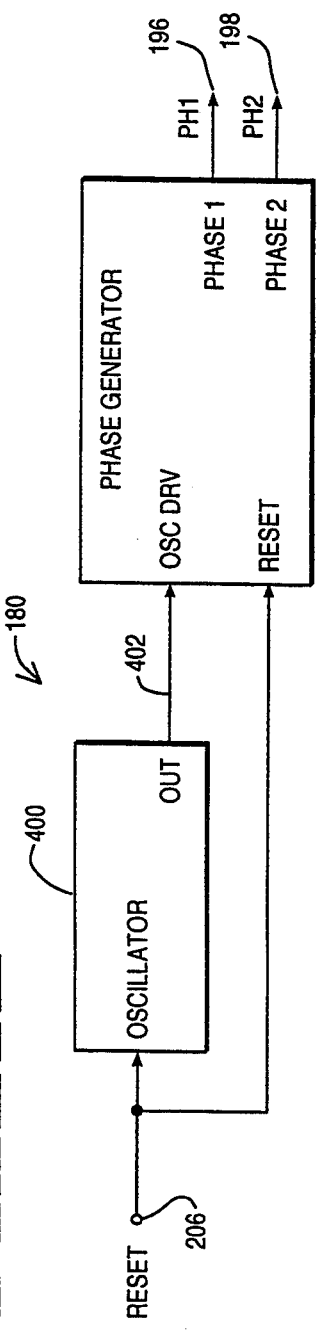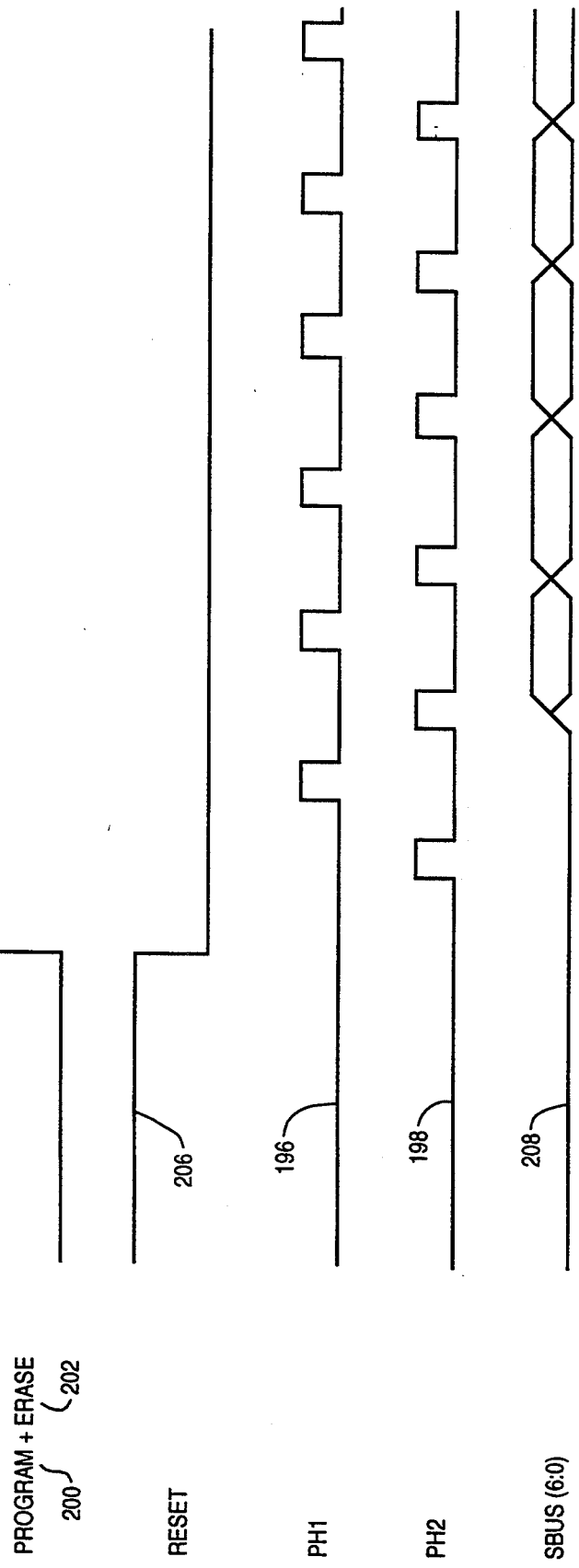

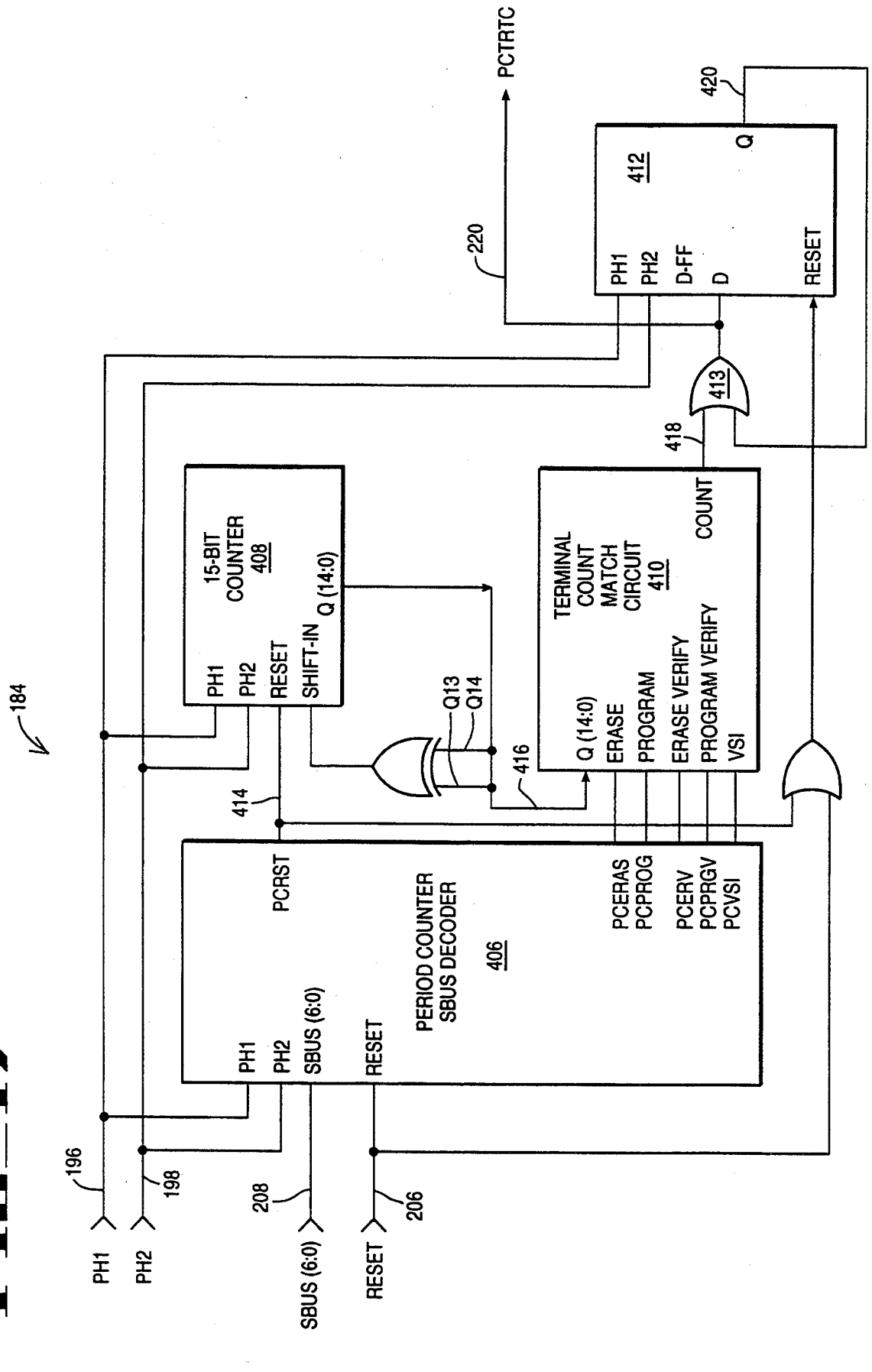
FIG._17

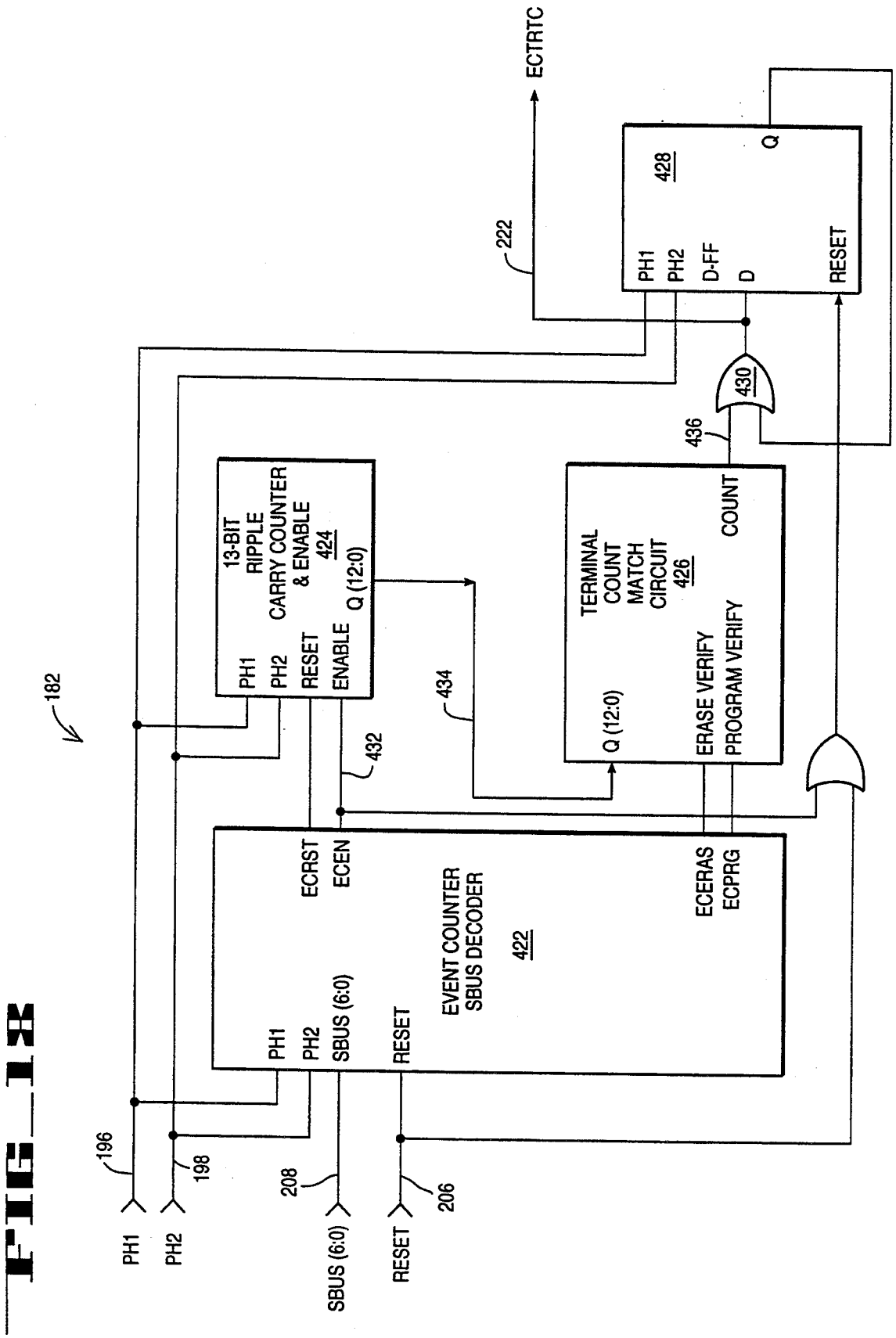

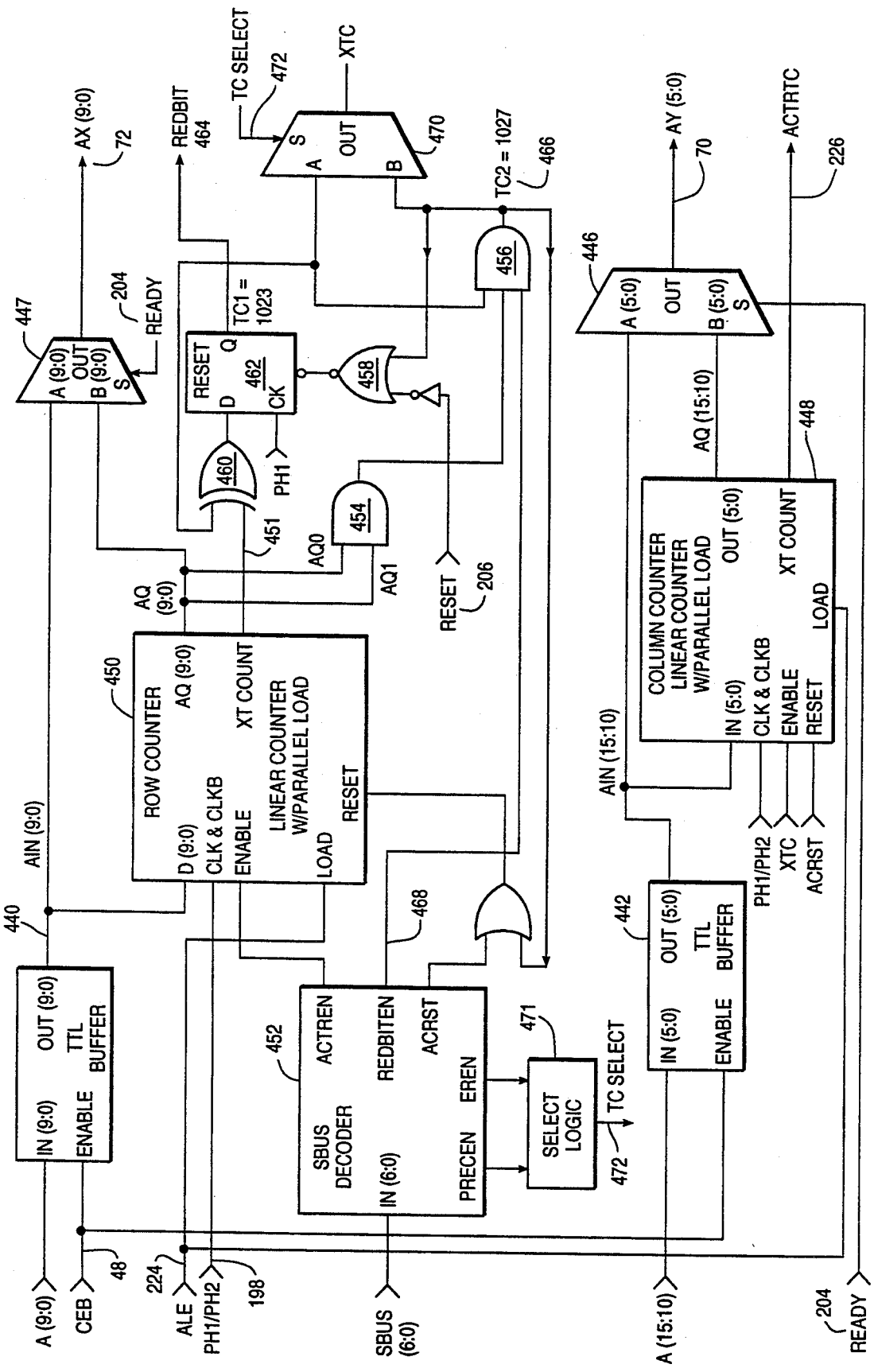
FIG_19

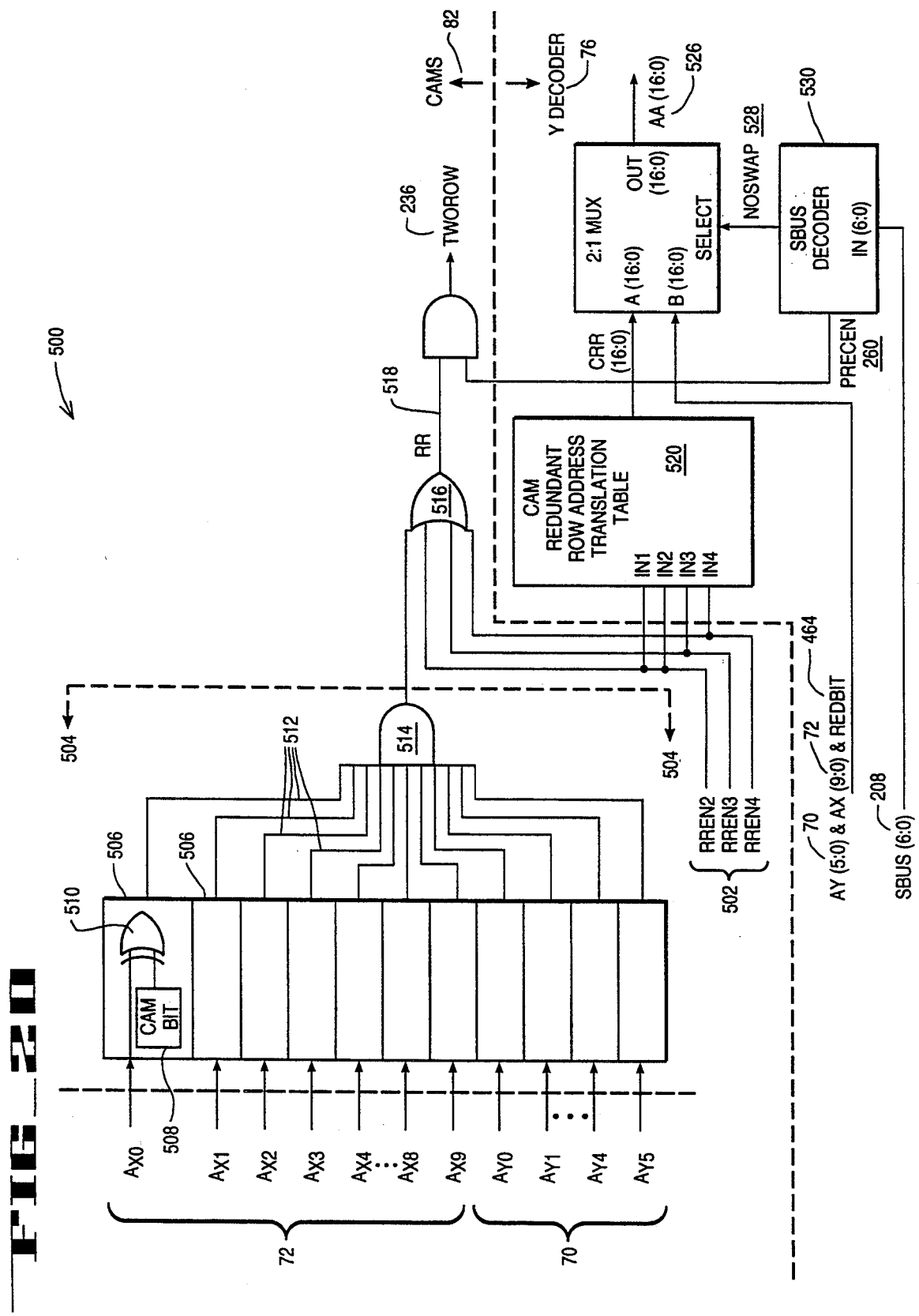

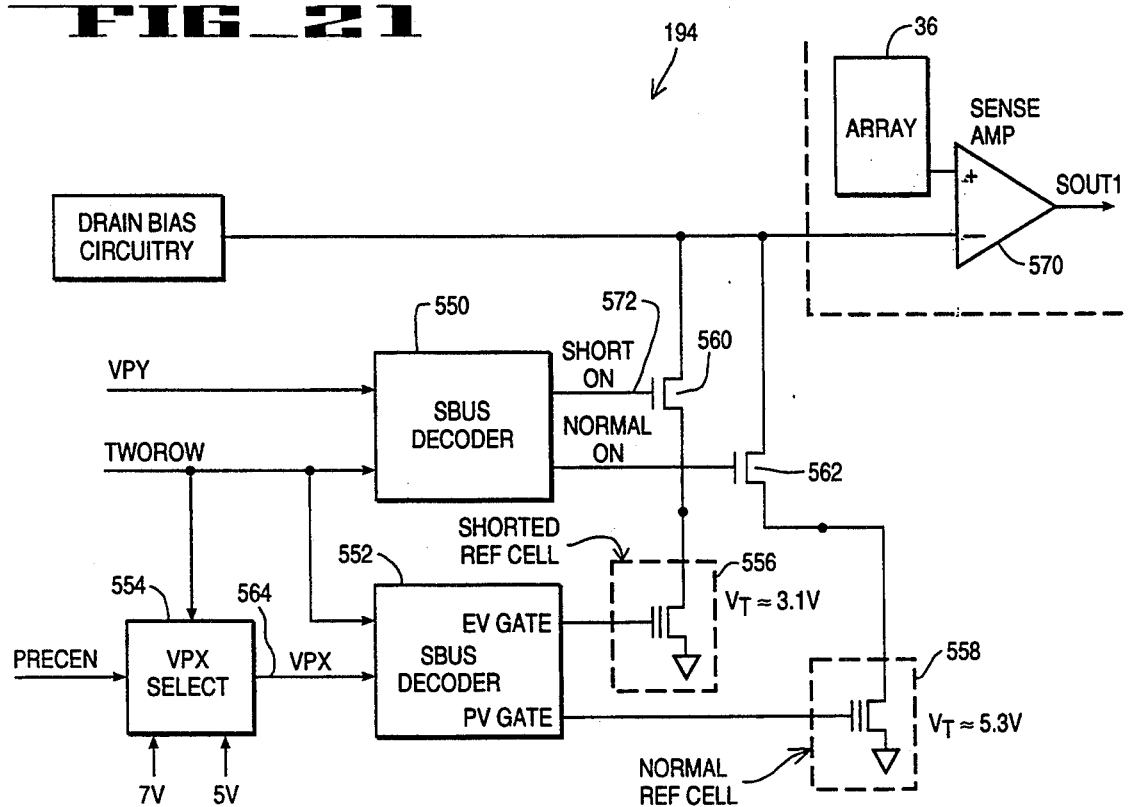
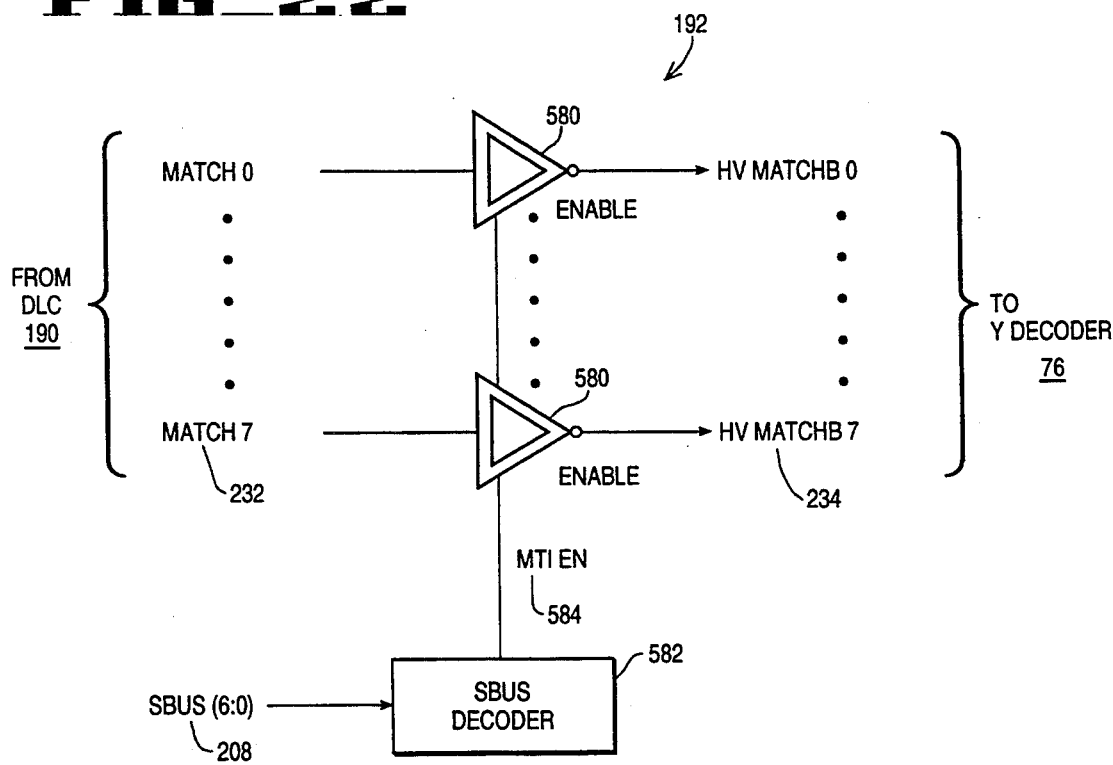

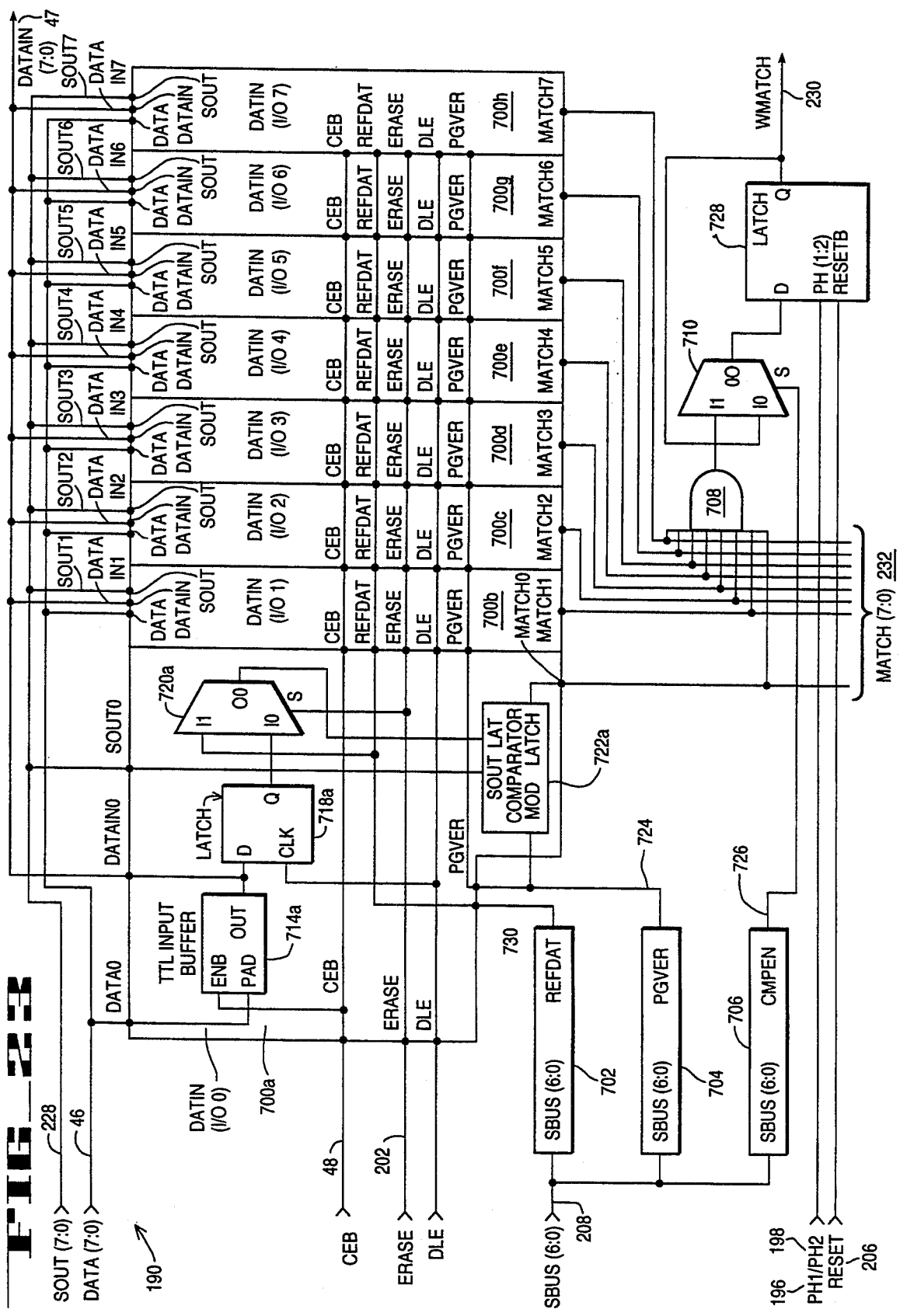

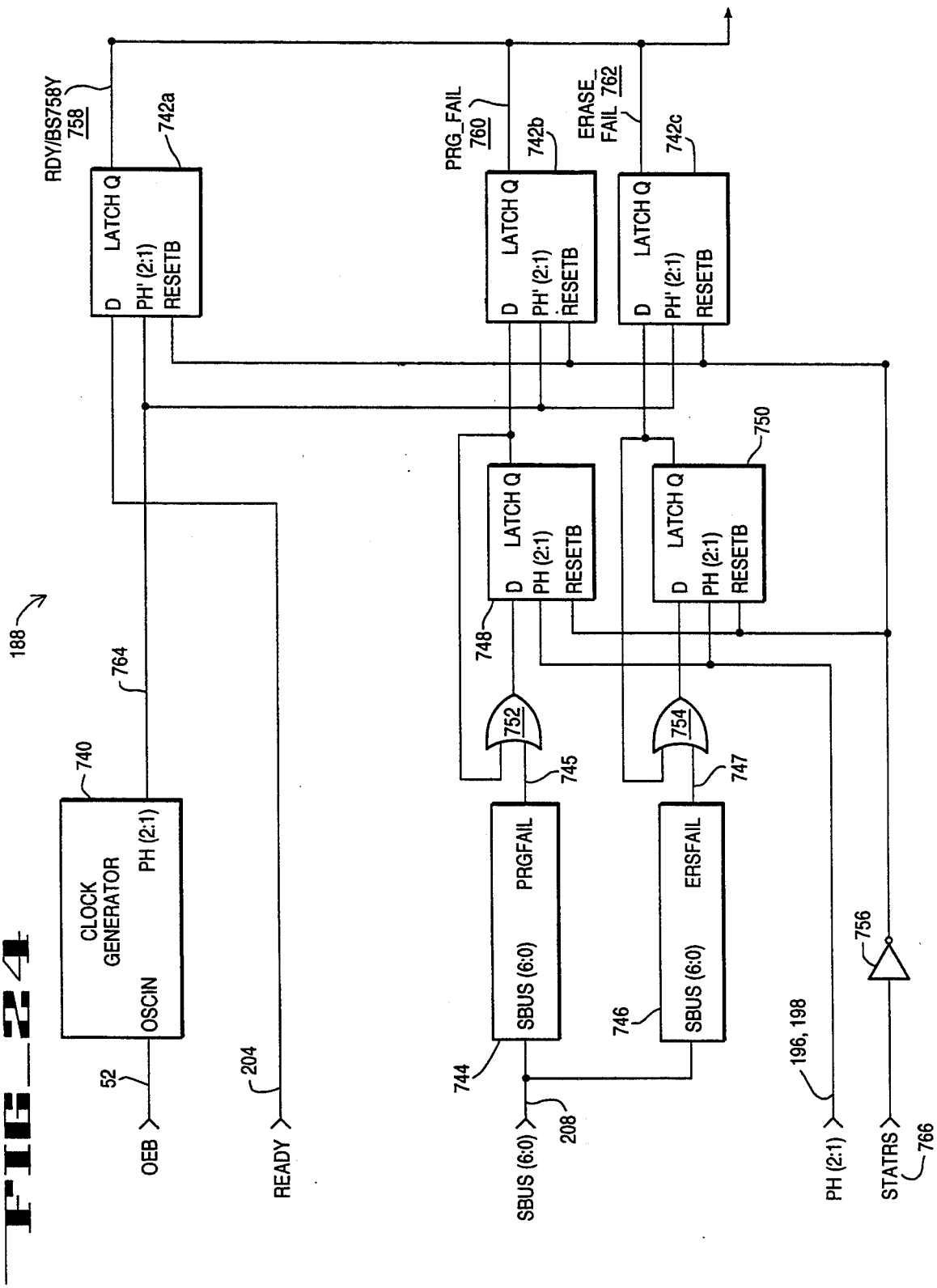
FIG_24

METHOD AND CIRCUITRY FOR PRECONDITIONING SHORTED ROWS IN A NONVOLATILE SEMICONDUCTOR MEMORY INCORPORATING ROW REDUNDANCY

FIELD OF THE INVENTION

The present invention relates to the field of nonvolatile semiconductor memories. More particularly, the present invention relates to a method and circuitry for preconditioning shorted rows within a nonvolatile semiconductor memory array incorporating redundant rows.

BACKGROUND OF THE INVENTION

One type of prior non-volatile semiconductor memory is the flash electrically erasable programmable read-only memory ("flash memory"). The flash memory can be programmed by a user, and once programmed, the flash memory retains its data until erased. After erasure, the flash memory may be programmed with new code or data.

Flash memories differ from conventional electrically erasable programmable read only memory ("EEPROMs") with respect to erasure. Conventional EEPROMs typically use a select transistor for individual byte erase control. Flash memories, on the other hand, typically achieve much higher density with single transistor cells. During one prior art flash memory erase method, a high voltage is supplied to the sources of every memory cell in a memory array simultaneously. This results in a full array erasure.

For one prior flash EEPROM, a logical "one" means that few if any electrons are stored on a floating gate associated with a bit cell. A logical "zero" means that many electrons are stored on the floating gate associated with the bit cell. Erasure of that prior flash memory causes a logical one to be stored in each bit cell. Every cell of that flash memory can only be written from a logical zero to a logical one by erasure of the entire array. Bit cells of the prior flash memory can, however, be individually overwritten from a logical one to a logical zero, given that this entails simply adding electrons to a floating gate that contains the intrinsic number of electrons associated with the erased state.

One prior flash EEPROM is the 28F256 complementary metal oxide semiconductor ("CMOS") flash memory sold by Intel Corporation of Santa Clara, Calif., which is a 256 kilobit flash EEPROM. The 28F256 flash memory includes a command register to manage electrical erasure and reprogramming. Commands are written to the command register from a controlling microprocessor using standard microprocessor write timings. The command register contents serve as input to an internal state machine that controls erase and programming circuitry.

The controlling microprocessor controls the erasure and programming of the flash memory.

One disadvantage of this prior method of controlling erasure and programming using a microprocessor is that it ties up the microprocessor, thus requiring a relatively high level of microprocessor overhead. This, in turn, decreases system throughput.

Another prior flash memory is the 28F001 CMOS flash memory sold by Intel Corporation of Santa Clara, Calif. The 28F001 is a 1 megabit flash memory, which incorporates a prior write state machine. The prior write state machine automatically programs and erases the array upon receipt of a two stage command from the command port. The prior write state machine thus simplifies erasure and programming for flash memory users. The prior write state machine increases system throughput by freeing the controlling microprocessor for other tasks.

A disadvantage of the prior flash memories is that they do not permit repair or replacement of shorted rows within the memory array. Prior flash memories incorporating shorted rows must be discarded.

SUMMARY OF THE INVENTION

An object of the present invention is to provide a method and circuitry for preconditioning shorted rows within a memory array incorporating redundant rows.

Another object of the present invention is to provide a method and circuitry for preconditioning that prevents shorted rows from leaking current onto bitlines.

Another object of the present invention is to provide a method and circuitry for preconditioning memory cells within shorted rows to threshold voltage levels lower than normal precondition levels but sufficient to prevent the quick overerasure of shorted rows during erasure.

A method of preconditioning and verifying the preconditioning of memory cells within shorted rows of a nonvolatile semiconductor memory array is described. As used herein, "shorted rows" refers to rows whose wordlines are shorted together. Shorted cells are preconditioned to a threshold voltage level lower than required for good cells, but sufficient to prevent shorted cells from overerasing quickly and causing bitline leakage. First, a preconditioning pulse is applied to two memory cells shorted together. Afterward, one of the two shorted cells is read by applying a nominal gate voltage level to the gates of both of the shorted cells. At the same time, a special reference cell, called a shorted reference cell, is read by applying a voltage level to its gate. The voltage level applied to the gate of the shorted reference cell is less than the nominal precondition gate voltage level. While the read voltages are being applied to the array cells and the shorted reference cell, the threshold voltage of one of the two shorted cells is compared to the threshold voltage of the shorted reference cell. The shorted reference cell has a threshold voltage level that is lower than the level normally required for preconditioning but is sufficient to prevent the quick overerasure of the shorted memory cells. As a result of the lower threshold voltage of the shorted reference cell, shorted cells pass precondition verify with lower threshold voltages than good cells. This is acceptable because the shorted rows do not contain user data, because they have been replaced by redundant rows. Shorted cells need only be preconditioned to threshold voltage levels sufficient to prevent quick overerasure.

Also described is circuitry for verifying the preconditioning of shorted cells within a flash memory array, which incorporates row redundancy. The preconditioning circuitry accommodates shorted cells, allowing them to pass verification at lower threshold voltage levels than good cells but ensuring the threshold voltage levels of shorted cells are high enough to prevent bitline leakage. The circuitry includes a sense amplifier for comparing the threshold voltage of a memory cell within the memory array to a selected reference threshold voltage level. The sense amplifier indicates whether the array memory cell exceeds the selected reference threshold voltage level. Selection circuitry couples two different reference cells to the sense amplifier, each having a different threshold voltage level. One of the reference cells has a nominal threshold voltage level; i.e., a threshold voltage level to which good cells should be preconditioned. The other reference cell, a shorted reference cell, has a threshold voltage less than the nominal threshold voltage, but sufficient to prevent the quick overerasure of array cells during erasure. When the array cell is shorted to another cell within the array, selection circuitry selects the shorted reference cell. Otherwise, the other reference cell is selected.

Other objects, features, and advantages of the present invention will be apparent from the accompanying drawings and from the detailed description that follows.

BRIEF DESCRIPTION OF THE FIGURES

The present invention is illustrated by way of example and not limitation in the figures of the accompanying drawings in which references indicate similar elements and in which:

FIG. 1 is a block diagram of a flash memory.

FIG. 2 is a table of flash memory commands.

FIG. 3 is a schematic of a portion of a memory array.

FIG. 4 is a block diagram of the write state machine.

FIG. 5 is a diagram of the next state controller.

FIG. 6 is a state diagram for the algorithm implemented by the Sequencer algorithm.

FIG. 7 is a table of signal names.

FIG. 8 is a table of SBUS(6:5) values for each state of the Sequencer.

FIG. 9 is a state diagram for the algorithm implemented by the Precondition Controller.

FIG. 10 is a table of SBUS(6:0) values and logic signal levels for each state of the algorithm implemented by the Precondition Controller.

FIG. 11 is a state diagram for the algorithm implemented by the Erase Controller.

FIG. 12 is a table of SBUS(6:0) values and logic signal levels for each state of the algorithm implemented by the Erase Controller.

FIG. 13 is a state diagram for the algorithm implemented by the Program Controller.

FIG. 14 is a table of SBUS(6:0) values and logic signal levels for each state of the algorithm implemented by the Program Controller.

FIG. 15 is a block diagram of the oscillator and phase generator.

FIG. 16 is start-up timing diagram for the oscillator and phase generator.

FIG. 17 is a block diagram of the period counter.

FIG. 18 is a block diagram of the event counter.

FIG. 19 is a block diagram of the address counter.

FIG. 20 is a diagram of a portion of the CAMS and the Y Decoder.

FIG. 21 is a block diagram the reference cell selection circuitry.

FIG. 22 is a block diagram of match translation and inversion circuitry.

FIG. 23 is a block diagram of the data latch and comparator.

FIG. 24 is a schematic of the status register.

DETAILED DESCRIPTION

FIG. 1 illustrates in block diagram form the circuitry of flash EEPROM 30, which is also referred to as flash memory 30.

As will be described in more detail below, flash memory 30 includes a next state controller 34 within write state machine 32. Next state controller 34 includes five controllers. One controller, the precondition controller, manages the preconditioning of memory array 36 prior to erasure. The precondition controller preconditions memory array 36, preventing shorted rows from leaking current onto bitlines during erase verification. The precondition controller does so by preconditioning shorted cells to a lower threshold voltage level than good cells.

As will also be described in detail below, flash memory 30 includes reference cell selection circuitry 35 within write state machine 32. Reference cell selection circuitry 35 allows the precondition controller to verify the preconditioning of memory array 36. Reference cell selection circuitry 35 includes a special reference cell that allows shorted cells to be preconditioned to voltage levels lower than the normal precondition level but sufficient to help prevent shorted rows from being overerased.

In this application, signals will be generally referred to by signal names. Particular signal names may be varied without departure from the scope and spirit of the present invention. Further, signal states will be referred to as being active or inactive, high or low, one or zero, true or false, etc.. Signals which are active when low are indicated by a suffix of "B"; i.e. XXXB. As examples of these signal naming conventions, see Table 1 below:

TABLE 1

| SIGNAL NAMES | ELECTRICAL NOTATION | LOGICAL NOTATION | STATE |
|---|---|---|---|
| READY | High | 1 or true | Active |
|  | Low | 0 or false | Inactive |
| RESETB | Low | 1 or true | Active |
|  | High | 0 or false | Inactive |

In describing groups of signals a decimal radix convention may be used, such as using AY(5:0) to refer to all 6 signals of a group. Within each group, the least significant bit of the group is referred to with a suffix of "0." In other words, AY0 refers to the least significant bit of the group and AY5 refers to the most significant bit.

Referring again to FIG. 1, Vpp 38 is the erase/program power supply voltage for flash memory 30. Vcc 40 is the device power supply for flash memory 30 and Vss 42 is ground. In one embodiment, Vpp 38 is 12.0 volts and Vcc 40 is approximately 5 volts.

In the absence of high voltage on Vpp 38, flash memory 30 acts as a read-only memory. The data stored at an address supplied via lines 44 is read from memory array 36 and made available via data input/output lines 46 to the circuitry external to the flash memory 30, such as microprocessor 999.

Flash memory 30 has three control signals: chip-enable bar CEB 48, WEB 50, and output-enable bar OEB 52. CEB 48 is the power control and is used to select flash memory 30. CEB 48 is active low. OEB 52 is the output control signal and is used to gate data from the data pins 46 from flash memory 30. OEB 42 is active low. Both control signals, CEB 48 and OEB 52, must be logically active to obtain data on data lines 46 of flash memory 30.

The write enable bar signal, WEB 50, allows writes to command state machine 60 while CEB 48 and write enable bar signal 50 are logic 0s. Addresses and data are latched on the rising edge of WEB 50. Standard microprocessor timings are used.

Commands to program or erase memory array 36 are applied via data lines 46. The data on lines 46 is passed on to command state machine ("CSM") 60. CSM 60 decodes the data and if it represents an erase, program or status register reset command, CSM 60 begins generating appropriate control signals for write state machine 32. FIG. 2 defines certain commands.

SRD in FIG. 2 represents data read from a status register within write state machine 32. PA in FIG. 2 represents the address of the memory location to be programmed and PD represents the data to be programmed at address PA.

Erase is executed on all of array 36 at once and is initiated by a two-cycle command sequence. An erase-setup command is first written, followed by the erase-confirm command. Array preconditioning, erase and erase verification are all handled internally by write state machine 32, invisible to the microprocessor 999.

This two step erase, set-up followed by execution, ensures that memory contents are not accidentally erased. Erasure can occur only when high voltage is applied to Vpp 38. In the absence of this high voltage, the memory array contents are protected against erasure.

The erase event involves three major tasks: preconditioning, erasure and post-erase repair, if desired. Preconditioning array 36 brings cell threshold voltages to a minimum level of approximately 5.3 volts and prolongs the longevity of the array 36 by preventing cell threshold voltages from dropping to levels during erasure that could result in cell leakage. Erasing brings cell voltages to levels below approximately 3.25 volts, a logic 1. Post-erase repair, also referred to as postconditioning, repairs overerased cells by bringing threshold voltages below zero volts up to approximately 3 volts.

Microprocessor 999 can detect the completion of an erase event by issuing a Read Status Register command and analyzing the status data. When the status register indicates that the erase event is over, the erase failure status bit should be checked. After examination, the status register error bits should be cleared as appropriate.

Programming is also executed by a two-cycle command sequence. The Program Set-up command is written to command state machine 60 via data lines 46, followed by a second write command specifying the address and data to be programmed. Write state machine 32 then takes over, controlling the program and verify algorithms internally. Polling the status register with the Status Register Read command will determine when the programming sequence is complete. Only the Read Status Register command is valid while programming is active.

When the status register indicates that the programming event is over, the program fail bit should be checked. After examination, the microprocessor 999 should clear the status register error bits as appropriate.

In a preferred embodiment, the circuitry of flash memory 30 shown in FIG. 1 resides on a single substrate. In a preferred embodiment, flash memory 20 employs CMOS circuitry.

Flash memory 30 includes memory array 36, which uses memory cells to store data. Shorted rows within memory array 36 can be replaced by redundant rows 80. In addition, flash memory 20 includes on-chip command state machine 60, a synchronizer, write state machine ("WSM") 32 and a status register.

The program and erase algorithms are regulated by write state machine 32 as will be discussed in detail herein below.

Write state machine 32 latches in the necessary address and data needed to complete erase and program operations from address lines 44 and data lines 46.

The write state machine 32 interfaces with memory array 36 via array address signals AY(5:0) 70 and AX(9:0) 72 and sense amp outputs SOUT (7:0) 228, which represent the data stored at the addressed memory location.

X decoder 74 selects the appropriate row within array 36 in response to AX(9:0) 72. For this reason, X decoder 74 is also called row decoder 47. Similarly, in response to AY(5:0) 70 Y decoder 76 selects the appropriate columns in array 36. Y decoder 76 is also called column decoder 76.

Data read from array 36 is output to Y decoder 76, which passes the data to sense amplifiers 78. Sense amplifiers 78 determine whether the threshold voltages of array cells exceed a reference level. Sense amplifiers 78 pass their information, SOUT (7:0), to write state machine 32.

Content addressable memories, CAMS 82, enable redundant rows 80 when appropriate. Each CAM stores the address of a defective row within array 36. Each CAM 82 compares the address it stores to address signals 70 and 72. When a match occurs, a redundant row is activated. CAMS 82 also inform write state machine 32 of the addressing of a shorted row via a signal, TWOROW 236.

A more detailed description of array 36 will aid later explanations of next state controller 34. FIG. 3 illustrates a portion 100 of memory array 36. Portion 100 includes several memory cells 110–132, each of which is a field effect transistor. Cells 110–132 are formed at the intersections of word lines 140–146 and bit lines 150–156, as is the common practice.

Each of word lines 140–146 is coupled to the gates of memory cells in one row. For example, word line 142 is coupled to the gates of memory cells 118–124.

Each of the bit lines 150–156 is coupled a column of memory cells. For example, bit line 152 is coupled to the drains of memory cells 112, 120 and 128. Bit lines 150–156 are also coupled to Y decoder 76.

Common source line 160 is coupled to source switch 37, which regulates the voltage levels applied to the sources of array memory cells 110–132. Common source line 160 is also coupled to first local source lines 162–166 and second local source lines 170–174. Each first local source line 162–166 is coupled to a particular row of array 36. Similarly, each second local source line 170–174 is coupled to a particular column. Together, source lines 162–166, 170–174, and 160 provide a path for applying voltages to the sources of cells 110–132.

As currently employed, memory cells 110–132 are programmed, preconditioned, and postconditioned by applying a potential of approximately 12 volts to word lines 140–144, a potential of approximately 7 volts to bit lines 150–156, and tying common source line 160 to ground. Properly programmed and preconditioned memory cells have a threshold voltage of approximately 5 volts.

Memory cells 110–132 are erased by applying a potential of approximately 12 volts to common source line 160, grounding word lines 140–144, and allowing bit lines 150–156 to float. Properly erased memory cells have a positive threshold voltage somewhere between 0 volts and 3 volts.

Erasure programming, preconditioning and postconditioning of array 36 are all accomplished using algorithms controlled by next state controller 34. These algorithms repeatedly apply the appropriate pulses to array 36 until the slowest responding cell array 90 reaches an acceptable threshold voltage.

These algorithms need to deal with shorted memory cells because even when replaced by redundant rows 80 shorted memory cells effect the preconditioning, erasure and postconditioning of good memory cells. This is because defective memory cells "leak" current onto bitlines 150–156, which is particularly troublesome during erase verification.

Defective memory cells tend to erase much faster than other, good, memory cells. Defective memory cells can be erased to threshold voltages below the minimum acceptable erase voltage, typically zero volts, in the same time necessary to bring the threshold voltage of the slowest erasing good cells down to the highest acceptable erase level; i.e., to approximately 3 volts. These defective memory cells may then induce a leakage current on their associated bit lines 150–156, even with their gates grounded. As a result, during erase verification of properly erased cells the current sensed by sense amplifiers 78 will be the sum of the properly erased cell's current and the bit line leakage current. Because of this, properly erased cells may be misidentified as overerased during postconditioning.

Misidentification of properly erased cells poses the danger that properly erased cell will be unnecessarily postconditioned in an attempt to make the cell pass postcondition verify, which can cause over-repair. Over-repair occurs when a cell's threshold voltage is raised above the upper acceptable limit for erasure, i.e., above approximately 3 volts.

The precondition algorithm of the present invention attempts to prevent overerasure and overrepair caused by shorted cells on a column. Because shorted cells do not contain meaningful information there is no need to raise their threshold voltages to normal precondition voltage levels. But shorted memory cells must be preconditioned to voltage levels sufficient to prevent their quick overerasure and current leakage onto bitlines. As will be described in more detail later, these goals are achieved in part by the use of special reference cells during precondition verify by the precondition algorithm.

FIG. 4 illustrates in block diagram form write state machine 32, which controls the programming, precondition, erasure, and postcondition of array 36. Write state machine 32 includes an oscillator and generator 180, next state controller 34, an event counter 182, a period counter 184, an address counter 186, status register 188, data latch and comparator ("DLC") 190, match translation and inversion circuitry 192, and precondition reference cell selection circuitry 194.

Operation of write state machine 32 is initiated by two signals from command state machine 60. The program signal, PROGRAM 200, initiates programming of array 36 by write state machine 32. Similarly, the erase signal, ERASE 202, initiates an erase event by write state machine 32. As used herein, an erase event is the execution of two or more algorithms to bring array threshold voltages within a range of 3.0–0.5 volts.

A synchronizer (not shown) provides synchronization between write state machine 32 and command state machine 60. Upon receipt of either an active ERASE 200 or PROGRAM 202 signal, the synchronizer forces READY signal 204 to a logic low, indicating to command state machine 60 and the status register that write state machine 32 is busy. When write state machine 32 completes its operation, the synchronizer shuts down the write state machine 32 by setting a READY signal.

The synchronizer resets write state machine 32 whenever ERASE 200 and PROGRAM 202 are both a logic low by forcing RESET signal 206.

RESET 82 is applied to nearly all circuits within write state machine 32. RESET 82 forces critical nodes within write state machine 32 to known states. For example, RESET 82 forces to a logic zero the terminal count signals 88, 90 and 92.

Shortly after receiving an inactive RESET signal 82, the oscillator/phase generator 180 begins generating two non-overlapping phase clocks, phase 1, PH1 146, and phase 2, PH2 198, which are routed to nearly all of WSM 32.

Next state controller 34 controls and coordinates the activities of write state machine 32 and determine the WSM's next state. Next state controller 34 generates the seven bit status signal SBUS(6:0) 208, which indicates the WSM's current state.

Next state controller 34 includes five controllers. One controller, the program controller, controls the programming of memory cells within array 36. Erase events are controlled by the other four controllers. One controller, the sequencer, oversees erasure by enabling and disabling the precondition, erase, and postcondition controllers, as appropriate. Distribtuion of intelligence allows each algorithm to be optimized. Nesting of erase control allows further optimization of erasure by permitting the reordering of precondition, erase, and post condition as desired. The precondition controller manages the preconditioning of memory array 36 prior to erasure. The erase controller controls the erasure of memory array 36 and the postcondition controller manages post-erase repair.

Each circuit receiving SBUS (6:0) 208 from next state controller 34 performs its own SBUS (6:0) decode to determine its next task. This design allows many tasks to be performed in parallel, minimizing the time needed to perform erase and program functions.

The period counter 184 determines and times the pulse periods for array voltages during program, precondition, erase, and postcondition operations. Another period indicated by period counter 182 is the delay between programming or erasing and the output of valid data from sense amplifiers 78. By going active-high, terminal count signal PCTRTC 220 informs next state controller 34 that the selected period of time has elapsed.

Event counter 182 determines when the maximum number of program, erase operations, precondition, or postcondition pulses has been applied. When the maximum number of operations has been reached, event counter 182 informs next state controller 34 by bringing terminal count signal ECTRTC 22 to a logic high.

Within WSM 32, address counter 186 functions as both an input buffer and a counter. When READY 204 is high the address at address lines A(16:0) 44 is output to WSM 32 as signals AY (5:0) 70 and AX (9:0) 72. Signals AY(5:0) 70 and AX(9:0) 72 point to the location of the byte in memory array 36 which is to be programmed, erased, or read.

The address from A(16:0) 44 is loaded into counting circuitry via address latch enable signal, ALE 22. Address counter 186 then counts through all the addresses in memory array 36. Address counter 186 indicates to next state controller 34 that the end of memory has been reached by forcing terminal count ACTRTC 226 to a logic one.

Data latch and comparator (DLC) 190 is the interface between WSM 32, CSM 60, memory array 36, and data lines 46. TTL data input on data lines 46 is buffered by DLC 80 and passed on to command state machine 60 as DATAIN(7:0) 47.

DATAIN (7:0) 47 represents a program command, command state machine 60 directs DLC 190 to store the information on data lines 46 by setting the data latch enable signal, DLE 100, to a logic one.

DLC 190 compares the sense amp signals, SOUT (7:0) 228, which are indicative of memory cell contents, to a reference logic level during verify procedures and indicates successful verification to next state controller 34 by setting the match signal for the entire data word, WMATCH 104, to a logic high.

DLC 190 also outputs MATCH(7:0) 232, which indicate on a bit-by-bit basis whether each memory cell of a data word matches the appropriate reference level, with a logic 0 indicating that the two do not match. Match translation and inversion circuitry 192 ("MTI circuitry") allows only those bits that failed to verify to be programmed, preconditioned or postconditioned, as the case may be. MTI circuitry 190 does so by inverting MATCH(7:0) 232 and translating logic 0 signals to the 12 volt level applied to source lines during programming and preconditioning by Y decoder 76. The output signals from MTI circuitry 192 are HVMATCHB(7:0) 234.

Reference cell selection circuitry 35 selects between two possible reference cells during verification. During preconditioning the selection depends upon whether the currently addressed row is shorted to another, as indicated by the signal TWOROW 236. The appropriate reference cells are then coupled to the reference inputs of sense amplifiers 78. Reference cell selection circuitry 37 thus allows shorted rows to pass precondition verification with lower threshold voltages than required for good cells, but ensures that shorted cells have threshold voltages to sufficiently prevent bitline leakage.

Status register 188 reports the status of write state machine 32 to microprocessor 999 via status signals, which are multiplexed onto data lines 46. Status register 188 determines the status of write state machine 32 based upon the signals READY 204 and SBUS(6:0) 208.

FIG. 5 illustrates the interrelationship of the five controllers 240, 242, 244, 246, and 248 that make up next state controller 34. In the preferred embodiment, each controller 240, 242, 244, 246, and 248 is realized as a programmable logic array (PLA).

Next state controller 34 nests the control of erase events, allowing easy modification of erase events. CSM 60 controls initialization of erase events via ERASE 202, which enables Sequencer 242. In turn, Sequencer 242 controls the order and scheduling of the algorithms executed by precondition controller 244 and controllers 246 and 248.

Sequencer 242 schedules controllers 244, 246, and 28, as appropriate using the upper two bits of SBUS(6:0) 208. Controllers 244, 246, and 248 decode SBUS(6:5) using SBUS decoders 245, 247, and 249 to determine whether they have been enabled as indicated by precondition enable signal PRECEN 260, erase enable signal, ERASEN 262, and postcondition enable signal POSTCEN 264, respectively. Controllers 244, 246, and 248 inform Sequencer 242 of task completion via SBUS(4:0). Sequencer 242 decodes SBUS(4:0) using SBUS decoder 243.

Precondition controller 244 controls the preconditioning of memory array 36. As used herein, "preconditioning" refers to the process prior to erasure of raising most memory cell threshold voltages to approximately 5 volts. Preconditioning memory cells prolong the useful lifetime of memory array 36 by preventing cell threshold voltages from dropping to levels that could result in bitline leakage. Preconditioning is performed much like programming. That is, preconditioning is performed by applying approximately 12 volts to the gate, 5–7 volts to the drain, and grounding the source of a memory cell. Preconditioning varies from programing in that both shorted rows and redundant rows are preconditioned.

Erase controller 246 controls the erasing of array 36. Erasing refers to the process of lowering memory cell threshold voltages of the entire array to within a range of 3 volts to 0 volts. Erased cells store a logic 1 according to flash memory conventions.

Postcondition Controller 248 manages the postconditioning of array 36. Postconditioning is also referred to as post-erase repair. Both terms refer to the repair of overerased cells using low-level programming. Like preconditioning, postconditioning is performed on both sorted rows and redundant rows 80. Postconditioning raises the threshold voltages of overerased cells from 0 volts, or less, to approximately 3 volts. Postconditioning is not absolutely necessary to erasure; however, it does prolong the useful lifetime of memory array 36 by repairing overerased cells.

When enabled, each controller determines the next state of each circuit within write state machine 32 based upon the write state machine's previous state, as represented by SBUS(6:0) 208, and upon ACTRTC 226, ECTRTC 222, PCTRTC 220, WMATCH 230, and TWOROW 236. Each circuit providing an input to controllers 240, 242, 244, 246, and 248 does so by the next active PH2 198 following SBUS(6:0) 208 active. They are able to do so because all circuits within write state machine 32 are master/slave with outputs valid on PH2 198.

Program controller 240 controls the programming of memory array 36 when enabled by PROGRAM 200. During programming, shorted rows are replaced by redundant rows 80. As used herein, "programming" refers to the process of raising the threshold voltages of memory cells to approximately 5 volts. A cell is programmed by applying approximately 12 volts to the gate, 7 volts to the drain, and grounding the source. A programmed cell stores a logic 0.

SBUS(6:0) 208 is latched into latches 238 and provided to the rest of the write state machine circuitry.

State bus outputs SBUS(6:0) 208 become active on the second PH2 198 rising edge after RESET 206 is cleared. As a result of SBUS (6:0) 208 being PH2 198 active, each WSM 32 circuit evaluates SBUS (6:0) 208 while PH1 196 is high.

Consider the response of controllers 242, 244, 246, and 248 to an active ERASE 202 signal. Sequencer 242 is fired by active ERASE 202. The algorithm implemented by Sequencer 242 is illustrated by the state diagram of FIG. 6. Briefly described, the erase event illustrated in FIG. 6 includes preconditioning, followed by erasure, which is in turn followed by post-erase repair.

In FIG. 6, each bubble represents a state of write state machine 32. The name of each state is indicated on the top line of each bubble. The signals which are selected or enabled during each state are listed below the state name. The combination of signals that cause Sequencer 242 to branch to another state are generally indicated in text beside each branch, with inactive signals preceded by an exclamation point "!" These signal names are explained in FIG. 7. It will be understood that Sequencer 242 branches from one state to another state regardless of the inputs to Sequencer 242 when no combination of signals is indicated next to a branch. FIG. 8 is a table of SBUS(6:5) values for each state shown in FIG. 6.

When power is first applied to flash memory 30, Sequencer 242 is held in POWER-UP state 120. No events occur in this state. Sequencer 242 begins execution after an active ERASE 202 is received from command state machine 60.

Assume that after power-up, Sequencer 242 decodes a hardware error, i.e., decodes active HARDERROR. HARDERROR causes Sequencer 42 to branch to the HARDWARE-ERROR state 282.

In HARDWARE_ERROR state 282, the status register's two fail bits, PRG_FAIL and ERASE_FAIL are set to a logic high, indicating a hardware failure. From state 282, Sequencer 242 branches to Clear Ready state 284.

In Clear Ready state 284, Sequencer 242 sets SEQRDY signal and WAITING signal, indicating to CSM 60 that write state machine 32 will soon be ready for another command. From state 284, Sequencer 242 branches to state 286.

No events occur in Power Down state 286. Sequencer 242 branches back to POWER UP state 280.

Assume that there are no hardware errors upon receipt of active ERASE 202. Because HARD ERROR is inactive, Sequencer 242 branches to state 288 from state 280.

In Precondition On state 288, Sequencer 242 fires Precondition Controller 244 by forcing SBUS(6:5) to a logic 01 (binary). Sequencer 242 remains in state 288 until Precondition Controller 244 successfully preconditions all of memory array 36, as indicated by active PLADONE, or until Precondition Controller 244 fails, as indicated by active PLAFAIL.

In Erase On state 290 Erase Controller 246 is enabled by Sequencer 242. Sequencer 242 remains in state 290 until Erase Controller 244 successfully erases all of memory array 36, as indicated by active PLADONE, or until Erase Controller 246 fails, as indicated by active PLAFAIL.

If Erase Controller 246 fails to erase the entire array, Sequencer 242 branches to Clear Ready state 284. From state 284, Sequencer 242 branches through states 286 and 280 as described previously. On the other hand, if memory array 36 is successfully erased, as indicated by active PLA DONE and inactive PLA FAIL, then Sequencer 242 branches to Postcondition On state 292.

In Postcondition On state 292, Sequencer 242 enables Postcondition Controller 248 by forcing SBUS(6:5) to a logic 11 (binary). Sequencer 242 remains in state 292 until memory array 36 is successfully postconditioned, as indicated by active PLADONE, or until Postcondition Controller 248 fails, as indicated by active PLAFAIL. Regardless of whether Postcondition Controller 248 is successful or not, Sequencer 242 branches to state 284 from state 292. From state 284, Sequencer 242 branches through states 286 and 280 as described previously.

In an alternative embodiment, Sequencer 242 implements an erase event including overrepair repair. In other words, Sequencer 242 repairs cells overrepaired by Postcondition Controller 248. Overrepaired cells are cells with threshold voltages above 3.0 volts after postconditioning. This condition is identified by Erase Controller 246 during erase verification. Thus, after Postcondition Controller 248 signals completion, Sequencer 242 branches directly into the erase verification states of Erase Controller 246.

FIG. 9 is a state diagram illustrating the algorithm implemented by Precondition Controller 244. The algorithm of FIG. 9 preconditions not only good memory cells, but also shorted rows that have been replaced by redundant rows 80. The algorithm raises the threshold voltages of cells within shorted rows to levels sufficient to prevent their bitline leakage during erase verification. Further, shorted cells are not preconditioned or verified to the same threshold voltage levels as good memory cells.

Preconditioning both shorted and good rows requires the ability to address both shorted rows and redundant rows 80 independently of each other. Thus, Precondition Controller 244 prevents the swapping of redundant rows 80 for shorted rows. Controller 244 addresses redundant rows 80 using unique addresses, rather the addresses of the shorted rows, as is done during reads, for example. Precondition controller 244 prevents the replacement of shorted row via active NOSWAP, thus addressing shorted rows. Redundant bit signal, REDBIT allows Precondition Controller 244 to address redundant rows 80 in addition to main array 36.

FIG. 9 uses the same notational conventions as FIG. 6. FIG. 10 is a table of SBUS(6:0) 208 values for each state shown in FIG. 9. Signal names used in FIGS. 9 and 10 are explained in FIG. 7.

To begin, consider preconditioning in the simplest situation. That is preconditioning in the absence of shorted rows. In other words, in the following discussion TWOROW 236 is, and remains, inactive.

Upon receipt of an active PRECEN signal 260, Precondition Controller 244 enters POWER Up state 300. Precondition Controller 244 disables the replacement of shorted rows with redundant rows 80 by bringing NOSWAP active. NOSWAP is held active by Precondition Controller 244 throughout all preconditioning states.

Precondition controller 244 branches to Begin state 302 from state 300. In Begin state 302, Precondition Controller 244 prepares for precondition by resetting most of the circuits within write state machine 32 and by turning on the various voltage sources applied to memory array 36. First, event counter 182 is reset. Second, address counter 186 is reset and its redundant access bit is enabled by REDBITEN. REDBITEN allows redundant rows 80 to be addressed in addition to main array 36. Precondition Controller 244 holds REDBITEN active throughout the precondition algorithm. Finally, period counter 184 is reset and its VSI count is selected, in preparation of applying a preconditioning pulse.

Precondition Controller 244 branches to state 304 from state 302. In VSI On state 304 a source inhibit voltage, VSI, is turned on and applied to the sources of all cells that are not to be preconditioned. This prevents the preconditioning of one cell from slowly programming other, unselected cells. Precondition Controller 244 remains in state 244 until VSI has been applied for a sufficient period of time, as indicated by active terminal count signal, PCTRTC 220.

From state 304, Precondition Controller 244 branches to Set Up state 306. In Set up 306, Precondition Controller 244 prepares write state machine 32 to apply a precondition pulse to the currently addressed byte with memory array 36. This is done by enabling the program path within memory array 36 and resetting period counter 184 and selecting its program count. The program count is chosen because precondition, program, and postcondition pulses are preferably all applied for the same period of time.

Precondition Controller 224 branches to state 308 from state 306. In Pulse state 308 a normal preconditioning pulse is applied to selected bits of the currently addressed byte. As used herein, a normal precondition pulse refers to the application of approximately 12 volts to wordlines, approximately 7 volts to bitlines, and tying common source lines to ground. Bits of the currently addressed byte are selected for preconditioning and programming by Match Translation and Inversion Circuitry 35 (MTI Circuitry), which is enabled during state 308.

While the precondition pulse is applied to selected bits of the addressed byte, VSI is applied to the sources of unaddressed cells, and gates are grounded to the unaddressed cells within memory array 36. Precondition controller 244 remains in Pulse state 308 until period counter 184 reaches its terminal count, indicating that the precondition pulse has been applied for a sufficient period of time to bring the threshold voltages of the currently addressed memory cells up to approximately 5 volts.

Precondition Controller 244 branches to Equalization state 310 from state 308. Events during Equalization 310 prepare write state machine 32 to perform precondition verification. Verification determines whether the previous precondition pulse successfully raised cell threshold voltages above 5 volts. Verification is a multistep process. First, the array cells to be verified are read by applying approximately 7 volts to cell gates, approximately 1.2 volts to cell drains, and grounding cell sources. At the same time, reference cells are read. Second, while the array cells and reference cells are being read, they are compared to each other by sense amplifiers 78. The sense amplifier outputs, SOUT(7:0) 228, inform DLC 190 whether each array cell has a threshold voltage level less than or greater than the threshold voltage level of the reference cells. Finally, DLC 190 compares SOUT(7:0) to data stored in its latches, thus determining whether each bit should have had a threshold voltage level less than or greater than the reference threshold voltage levels.

In state 310, period counter 184 is reset and its program verify count is selected. Event counter 182 is enabled to increment its count. Memory array 36 is enabled allowing the currently addressed byte to be read, and program verify circuitry within array 36 is turned on. In preparation of the upcoming read during verification, bitlines of cells not addressed are grounded. MTI circuitry 192 is disabled.

Now partially configured for verification, Precondition Controller 244 branches to state 312 from state 310. In Verify Delay state 312 write state machine 32 verifies that the currently addressed byte has been successfully preconditioned. First, normal reference cells are coupled to sense amplifiers 78. Normal reference cells have a threshold voltage level representative of properly preconditioned cells. That reference threshold voltage level is preferably 5 volts. These reference cells are selected by inactive TWOROW 236. The delay provided by period counter 184 ensures that SOUT(7:0) 228 is valid before verification is performed. Next, DLC 190 compares sense amplifier outputs SOUT(7:0) 228 to logic 0s. DLC 190 performs this comparison when enabled and reference data signal, REFDAT, is active. When period counter 184 reaches its terminal count, Precondition Controller 244 branches out of state 312.

Assuming that TWOROW 236 is inactive, Precondition Controller 244 may take one of two possible branches out of state 312. If the currently addressed byte failed precondition verification, as indicated by a logic 0 from WMATCH 230, and event counter 182 and address counter 186 have not reached their terminal counts, then Precondition Controller 244 takes branch 314 back to Setup state 306. Precondition Controller 244 branches through states 306 through 312 until either the currently addressed bytes verifies, as indicated by active WMATCH 230, or the maximum number of precondition pulses has been applied without success, as indicated by active ECTRTC. In this case, Precondition Controller 244 branches from state 312 to state 316.

In Increment Address state 316, Precondition Controller 244 enables address counter 186, thereby advancing its count. This prepares WSM 32 to precondition another byte. In state 316 Precondition Controller 244 also resets period counter 184 and event counter 182, and enables the array program path. VSI remains on.

Assuming that TWOROW 236 is inactive, Precondition Controller 244 takes branch 318 out of state 316. Precondition controller 244 then branches through states 308, 310, 312, and 316 verifying all cells within array 36 until address counter 186 reaches its terminal count. Once ACTRTC 226 goes active all memory cells within array 36 have been preconditioned and Precondition Controller 244 takes branch 320 to state 322.

Precondition Controller 244 prepares to turn control over to Sequencer 242 in VSI OFF state 322. Tasks in state 322 include resetting period counter 184, selecting its VSI count, enabling memory array 36, and turning off VSI. Precondition Controller 244 remains in state 322 an adequate period time to allow the charge placed on source lines by VSI to dissipate. When PCTRTC 220 becomes active, Precondition Controller 244 branches out of state 322.

Precondition Controller 244 enters Done state 246 from state 322. Precondition Controller 244 signals completion of precondition by setting PLAREADY. Event counter 182 and period counter 184 are readied for use by another controller by being reset.

Precondition Controller 244 branches from Done 246 back up to Power Up state 300. There Precondition Controller 244 awaits another active precondition enable, PRECEN 260.

Armed with this basic understanding of preconditioning, now consider preconditioning when memory array 36 includes shorted rows; i.e. TWOROW 236 goes active for at least one pair of addresses.

Preconditioning again begins upon receipt of active PRECEN 260. In state 300 Precondition Controller 244 disables the replacement of shorted rows with redundant rows 80 by bringing NOSWAP 528 active. This allows Precondition Controller 244 to address shorted rows. NOSWAP 528 is held active by Precondition Controller 244 throughout all preconditioning states. Precondition Controller 244 branches from state 300 to state 302.

In Begin state 302 Precondition Controller 244 prepares for preconditioning by resetting period counter 184, event counter 182, and address counter 186. As before, REDBITEN 468 is brought active allowing redundant rows 80 to be addressed independently of the shorted rows that they replace. When address counter 186 reaches the addresses of redundant rows 80, REDBIT 464 is allowed to go active.

Assume that the first address pointed to by address counter 186 is shorted to another row. The first shorted row addressed of a pair is referred to as the lower row and the second row addressed is referred to as the upper row. Because address counter 186 counts in a linear fashion the lower row is addressed first. TWO ROW 236 does not become active immediately upon addressing the lower row of a pair of shorted row, because of the design of WSM 32. Thus, TWO ROW 236 has no effect upon state 302. Nor does TWOROW 236 effect states 304 or 306, thus, Precondition Controller 244 branches through these states as discussed previously.

TWOROW 236 effects a vital difference in Pulse state 308. As discussed previously, memory array 36 and MTI circuitry 192 are enabled and VSI is applied to most of the array in state 308. In this case, precondition voltage levels are applied to the gates of both the lower row and the upper row to prevent damaging memory array 36. This is controlled by active TWOROW 236.

From Pulse state 308, Precondition Controller 244 branches to Equalization state 310. Equalization is unaffected by active TWOROW 236 and it is performed as discussed previously. Afterward, Precondition Controller 244 branches to state 312.

In state 312 Precondition Controller 244 verifies that the pair of shorted rows have been preconditioned to threshold voltages high enough to prevent overerasure but below normal precondition threshold voltage levels. This is because it is difficult to precondition shorted rows to normal threshold voltage levels. Active TWOROW 236 causes shorted reference cells to be coupled to the reference inputs of sense amplifiers 78. These shorted reference cells have threshold voltages of approximately 3.1–3.3 volts in the preferred embodiment. Other threshold voltage levels may be used so long as they prevent shorted cells from overerasing quickly and causing bitline leakage. As the result of using a lower reference threshold voltage level sense amplifiers 78 and DLC 190 are forced to identify the shorted cells as successfully preconditioned if they are preconditioned to at least the shorted threshold voltage level. When period counter 184 reaches its terminal count, Precondition Controller 244 branches out of state 312.

Given that a shorted row is addressed, as indicated by active TWOROW 236, there are two possible branches out of state 312. Precondition Controller 244 takes branch 326 back to state 306 if the shorted rows did not precondition to at least the shorted threshold voltage level and the maximum number of precondition pulses has not been reached. In other words, Precondition Controller 244 returns to Set Up state 206 when WMATCH 230 and ECTRTC 220 are inactive and PCTRTC 22 and TWOROW 236 are active. Precondition Controller 244 branches through states 206 through 312 until either event counter 182 reaches its terminal count or the shorted rows are successfully precondition verified. Precondition Controller 244 then branches to Increment Address state 316.

In state 316 address counter 186 increments its count and points to a new address. TWOROW 236 will be active immediately because address counter 186 now points to the upper row of a pair of shorted rows. Recall that the previous row was the lower row of a pair of short rows. Because TWOROW 236 is active, Precondition controller 244 remains in state 316 and increments the address counter's count again. This is because the upper row was preconditioned with the lower row. TWOROW 236 then goes inactive, even if address counter 186 points to the lower row of another pair of shorted rows. This is because the pipelined design of write state machine 32 prevents TWOROW 236 from going active immediately upon addressing the lower row of a pair of shorted rows.

Once TWOROW 236 goes inactive, Precondition Controller 244 branches out of state 320. If ACTRTC 226 is inactive preconditioning of memory array 36 continues by taking branch 318. On the other hand, Precondition Controller 244 begins shutting down by branching to state 322 if ACTRTC 226 is active.

Preconditioning complete, Sequencer 242 fires Erase Controller 246 by bringing ERASEN active 262. The state diagram of FIG. 11 illustrates the algorithm implemented by Erase Controller 246. The erase algorithm varies from precondition, postcondition, and program algorithms in that the entire array 36 is erased all at once, not on a byte-by-byte basis. Thus, it might seem that there is no need to replace shorted rows with redundant rows 80 during this algorithm. Not so, shorted rows are replaced by redundant rows 80 during erase verification, as will be discussed.

FIG. 11 uses the same notational conventions as FIG. 6. FIG. 12 is a table of SBUS(6:0) values and logic signal levels for each state of Erase Controller 246 shown in FIG. 11. Signal names are explained in FIG. 7.

Active ERASEN 262 brings Erase Controller 246 to Power Up state 330. No events occur in state 330 and Erase Controller 246 branches immediately to state 332.

Erase Controller 246 prepares to apply an erase pulse to array 36 in Set Up state 332. Array 36 is prepared by grounding all bitlines, resetting period counter 184 and selecting its erase count, PCTRERS. Erase Controller 246 then branches to state 334 from state 332.

In Pulse state 334 an erase pulse is applied to each cell of memory array 36 simultaneously. Erase Controller 246 does this by allowing bitlines to float, grounding wordlines and applying a potential of approximately 12 volts to local source lines. The erase pulse is held until period counter 184 reaches its terminal count, indicating a sufficient period of time has elapsed to pull most cell threshold voltages levels to within a range of 3 volts to 0 volts.

Erase Controller 246 branches to Pulse Off state 336 from state 334. In that state 336, write state machine 32 is prepared to verify erasure of memory array 36. Events in state 336 include grounding bitlines and enabling array 36. Erase Controller 246 enables event counter 182, allowing it to increment its count to reflect that an erase pulse was applied to memory array 36 in state 334. Erase Controller also resets period counter 184. Period counter 184 is reset in all states in which it is not enabled.

Erase Controller 246 branches to Verify state 338 from state 336. In state 336 Erase Controller 246 configures memory array 36 to erase verify the currently addressed group of array cells. During erase verification, NOSWAP is inactive allowing shorted rows to be replaced by redundant rows 80. Thus, it will be understood shorted rows are not erase verified.

In state 338, a number of events occur. First, period counter 184 is reset and its erase verify count is selected by bringing PCTRESV active. This ensures that Erase Controller 246 verifies valid data. Second, Erase Controller 246 couples erase verify reference cells to the reference inputs of sense amplifiers 78. Erase verify reference cells have threshold voltages approximately equal to the highest acceptable erase threshold voltage. In the preferred embodiment, the highest acceptable erase threshold voltage level is approximately 3.1 volts. This allows a single reference cell to be used both for erase verification and for precondition verification of shorted rows. Third, the currently addressed row within array 36 is read by applying a read pulse. TWO-ROW 236, if active, will ensure that a read voltage level is applied to the gates of both shorted rows of memory cells. Finally, Erase Controller 246 configures DLC 190 for erase verification. DLC 190 is enabled and its comparator verify reference data signal, REFDAT, is forced to the appropriate logic level. During erase verification properly erased cells should have threshold voltage levels below that of the reference cells. In comparison, during precondition verification array cells should have threshold voltage levels greater than those of reference cells. As a result, DLC 190 compares SOUT(7:0) to different logic levels during the two types of verification.

Once PCTRTC 220 goes active, Erase Controller 246 may take one of four possible branches of Verify state 338. Assume that address counter 186 has not reached its terminal count, the maximum number of erase pulses have not been applied to memory array 36 yet, and the currently addressed byte failed to verify. In that case, Erase Controller 244 takes branch 340 back to Setup state 332, to apply an additional erase pulse.

Upon return to Setup state 332, Erase Controller 246 branches through states 334, 336, and 338, applying another erase pulse to memory array 36 and erase verifying the byte that failed to verify previously. Erase Controller 246 continues to branch through states 332, 334, 336 and 338 until the currently addressed byte verifies or the maximum number of erase pulses that may be applied to array 36 is reached.

If ECTRTC 222 goes active before the byte then memory array 36 fails the erase algorithm. Erase Controller 246 responds to failure by taking branch 342 to state 348 out of state 338. In FAIL state 348 Erase Controller 246 signals its failure by setting the ERASE FAIL and PLAFAIL bits. Erase Controller returns 246 to Power Up state 330 afterward.

On the other hand, if the byte does verify now and event counter 182 has not reached its maximum count, then Erase Controller 246 takes one of two possible branches out of Verify state 338. Unless every byte in memory array 36 has been verified Erase controller 246 branches to state 350 from state 338. In other words, Erase Controller takes branch 344 when ACTRTC 226 is inactive, and PCTRTC 220 and WMATCH 230 are active.

In Increment Address state 350, Erase Controller 246 prepares to erase verify another byte of memory array 36 by enabling address counter 186 to increment its count and select another row of cells. Erase Controller 246 also maintains the configuration necessary to perform erase verification. For this reason, memory array 36, read path, and DLC 190 remain enabled, period counter is reset and its erase verify count selected, and the erase verify reference cells remain selected.

Erase Controller 246 branches to Verify Delay state 352 from state 350. Verify Delay state 352 adds a slight delay prior to verification. Erase Controller 246 maintains signals at those levels necessary to erase verification in state 352.

Erase Controller 246 branches back to Verify state 338 from state 352. There the currently addressed byte is erase verified. Erase Controller 246 then branches through states 332, 334, 336, 338, 350, 352, as appropriate, until event counter reaches its terminal count or memory array is successfully erased.

Erase Controller 246 branches to Done state 354 from state 338 when all of memory array 36 has been erased. There Erase Controller 246 signals its successful completion by setting PLADONE and resetting address counter 186 and event counter 182. Erase Controller then branches back to Power Up state 330 to await another active ERASEN 262.

The algorithm implemented by Postcondition Controller 248 will be only briefly described as it is the subject of U.S. Ser. No. 07/773,228, entitled "Method of Repairing Overerased Cells in a Flash Memory," which was filed Oct. 9, 1991. Postcondition Controller 248 repairs overerased cells using overerase verification circuitry and low voltage level programming. Repair begins by selecting a column and examining each cell on that column to determine whether any cells are overerased. This procedure is commonly referred to as overerase verification. A cell is identified as overerased when it conducts current in excess of the current expected at the lowest acceptable erase threshold voltage. Repair proceeds by applying a single, low-level programming pulse to the overerased cell. The voltage level of the programming pulse is low enough to ensure that the cell will not be over-repaired, regardless of the other operating conditions. The remaining cells on the column are examined in the same fashion. If any cell on the selected column was identified as overerased, each cell on the column is overerase verified a second time. Cells identified as overerased will again be programmed with a single low-level pulse. The voltage level of the programming pulse for the current repair pass is increased, however, as compared to the previous repair pass. These steps are repeated until none of the cells on the column are identified as overerased.

This repair method can tolerate a maximum bit line leakage current of hundreds of microamps. This robustness arises in part from the proper choice of the initial programming voltage level and the difference in behavior between defective cells and normal cells. Suppose that a column includes a severely overerased cell with a threshold voltage $V_T$ of approximately $-5$ volts. The severely overerased cell will draw sufficient current to cause all other cells on the same column to fail the overerase verify test. Post condition controller 248 programs each cell on the column once at a very low voltage level. The voltage of the initial programming pulse is chosen to be low enough to guarantee that none of the cells on the column will be over-repaired. In general, channel-hot-electron programming depends exponentially on the drive voltage ($V_G-V_T$), where $V_G$ is the gate voltage used during programming and $V_T$ is the threshold voltage of the cell being programmed. With $V_G$ equal to 5 volts, a properly-erased cell with a $V_T$ of 2 volts will program very slowly. In contrast, the severely overerased cell will program very quickly. Thus, the initial, low level programming pulse will have little effect on properly erased cells but will greatly effect the severely overerased cell. As a consequence of the initial programming/repair pass, the bit line leakage current during the next programming/repair pass is reduced. The multiple pass repair method helps eliminate errors caused by leakage current and helps reduce the risk of over-repair.

Beginning repair at a low gate voltage level is advantageous for another reason. No one specific voltage is optimum for repairing every flash memory, or even for the same flash memory across its usable lifetime, because channel-hot-electron programming characteristics vary with temperature, manufacturing condition, and amount of use. Thus, by starting at a low voltage level, the present overerase repair method accommodates a wide spectrum of specific optimum voltages.

FIG. 13 illustrates the algorithm implemented by Program Controller 240 when enabled by active Program signal 200. FIG. 13 uses the same notational conventions as FIG. 6. FIG. 14 is a table of SBUS(6:0) values and logic signal levels for each state of Program Controller 240 shown in FIG. 14.

The algorithm implemented by Program controller 240 differs from the algorithms of controllers 244, 246, and 248 in two ways. First, Program controller 240 programs only one byte each time it is fired. That byte is selected by the flash memory user and indicated by address counter 186 before Program controller 240 is fired. That byte will be replaced by a redundant row, if a shorted row is addressed. Second, the flash memory user indicates the information to be stored in the addressed memory location by writing the data into DLC 190. Flash memory 30 allows logic 1s to be overwritten to logic 0s during programming. Logic 0s cannot be changed to logic 1s during programming. Thus, Program Controller 240 programs only those bits selected by the flash memory user to be programmed to logic 0s from logic 1s.

Program Controller 240 begins execution in Power Up state 360. No events occur in state 360 and Program controller branches to VSI On state 362.

In VSI On state 362 Program Controller 240 enables the various voltage sources used during programming, including the source inhibit voltage source. Program controller 240 also enables memory array 36. Program controller 240 holds NOSWAP in active in state 362, and all subsequent states. Afterward, Program Controller 240 branches to state 366.

Set Up state 366 allows the various voltages source to continue to slew to appropriate voltage levels. Memory array 36 remains enabled. Program Controller 240 further configures write state machine 32 for programming by resetting period counter 184. Set up finished, Program Controller 240 branches to state 366 from state 364.

Program Controller 240 applies a programming pulse to the addressed byte in Pulse state 366. Period counter 184 is reset and its program count is selected to time the application of the programming pulse. VSI is applied to the other cells within memory array 36 to prevent undesired slow programming. Program Controller 240 also enables MTI circuitry 192 so that only those bits of the byte requiring programming are programmed. Program Controller 240 branches to state 368 when period counter 184 reaches its terminal count.

Program Controller 240 configures write state machine 32 to perform program verification in Equalization state 368. First, array bitlines are grounded and the program verify reference cell is selected. The program verify reference cell has a threshold voltage of approximately 5 volts in the preferred embodiment. The program verification reference cell is selected by inactive TWOROW 236 and SBUS(6:5). Second, voltage sources used during program verification are allowed to slew to appropriate voltage levels. Finally, period counter 184 is reset and memory array 36 remains enabled.

Other events occur during Equalization state 368. Program Controller 240 disables MTI circuitry 192, which is not needed during verification. Program Controller 240 enables event counter 182, allowing it to increment its count to reflect that a pulse was applied to the addressed byte in state 366. These matters disposed of, Program Controller 240 branches out of state 368 to state 370.

Program Controller 240 verifies the programming of the addressed byte in Verify Delay state 370. That is, Program Controller 240 determines whether the threshold hold voltage of each cell of the addressed byte exceeds a minimum voltage level of approximately 5 volts. To do so, Program Controller 240 continues to couple program verify reference cells to the reference inputs of sense amplifiers 78 and to couple the addressed byte to the other inputs of sense amplifiers 78. Period Counter 184 is reset and its program verify count selected to ensure that the outputs of sense amplifiers 78, SOUT(7:0) 228, are valid. SOUT(7:0) 228 are then compared to data stored in DLC 190 by enabling its program verify control signal and bringing CMPEN active.

Verification complete, Program Controller 240 may take one of two possible branches out of Verify Delay state 370. If the addressed byte failed to verify properly, as indicated by inactive WMATCH 232, then Program Controller 240 takes branch 370 back to Set Up state 364. Program Controller 240 will then branch through states 364, 366, 368, and 370 as just described. Eventually, Program Controller 240 must take branch 374 out of state 370.

Program Controller 240 takes branch 374 out of state 370 when one of two situations occurs. First, Program Controller 240 takes branch 374 when the byte has failed to program verify, as indicated by active ECTRTC 222. Second, Program Controller 240 takes branch 374 out of state 370 when the addressed byte has been successfully program verified. Success is indicated by active WMATCH 230.

Regardless of whether program verification was successful or not, Program Controller 240 enters VSI Off state 376 from branch 374. There Program Controller 240 allows the various program reference sources to slew down to read levels. VSI is turned off.

If programming failed, Program Controller 240 branches to Fail State 378 from state 376 because of inactive WMATCH 230 and active ECTRTC 222. Program Controller 240 indicates failure by setting the program fail bit. Program Controller 240 then branches to state 380. On the other hand, if programming was successful, Program Controller 240 branches directly to state 380 from state 376.

Program Controller 240 clears the status register's RDY/BSY bit in state 380. Program Controller 240 then branches to Power Down state 382, where no events occur. Program controller 240 then branches back to Power Up state 360 to await another program command.

Given this explanation of controllers 240, 242, 244, 246 and 248, consider now the remaining circuitry included in write state machine 32, which respond to SBUS(6:0) 208. Other circuits within WSM 32 include oscillator and phase generator 180, period counter 184, event counter 182, address counter 186, MTI circuitry 192, reference cell selection circuitry 194, DLC 190, and status register 188.

FIG. 15 illustrates in block diagram from oscillator and phase generator 180. Oscillator 400 begins operating upon receipt of an inactive RESET signal 206. Oscillator 400 runs as long as RESET 206 is inactive. When RESET 206 is asserted the oscillator 400 ceases to run.

Oscillator's output 402 is provided to phase generator 404. Phase generator 404 includes a two-bit shift register that is held inactive until activated. The shift register shifts through 4 combinations, namely the binary values of 00, 01, 11, and 10. Two decoders of phase generator 404 watch for the 01 and 10 states and generates two out clocks, PH1 196 and PH2 198, which are routed to nearly all of the WSM circuitry.

In the preferred embodiment, PH1/PH2 196 and 198 have a typical cycle time of 500 ns. The duty cycle of both PH1 196 and PH2 198 is approximately 25%.

The start-up timing for PH1 196 and PH2 198 in relation to RESET 206 and SBUS(6:0) 208 can be seen in FIG. 16. RESET 206 goes low on the rising edge of either PROGRAM 200 or ERASE 202. After RESET 206 falls PH2 198 is the first clock to go active high.

SBUS(6:0) 208 becomes active on the rising edge of the second PH2 198 pulse; all WSM 32 circuitry evaluates SBUS(6:0) 208 during PH1 196 active to guarantee valid readings.

FIG. 17 illustrates in block diagram form period counter 184. Period counter 184 includes a period counter SBUS decoder 406, 15 bit shift register counter 408, a terminal count match circuit 410, and latch 412.

Period counter SBUS decoder 406 controls counter 408 and terminal count match circuit 410. Decoder 406 decodes SBUS signals 208 and determines whether the counter's 212 count should be reset and selects among the three possible terminal counts.

The operation of SBUS decoder 406 in each state can be determined with reference to FIGS. 10, 12, and 14. For example, FIG. 10 indicates that in set up state 306, that SBUS decoder 406 resets period counter count by setting PCTRST to a logic 1.

SBUS decoder 406 is implemented as random logic in the preferred embodiment.

Shift register counter 408 does not incorporate a counter enable and thus continues to run in all states except for those in which it is reset by an active PCTRST signal 414.

The Q outputs 416 of the shift register 408 are fed to terminal count match circuit 410. Terminal count match circuit 410 analyzes Q outputs 416 and indicates when a selected terminal count is reached. The terminal count match circuit recognizes five possible terminal counts: erase, program, erase verify, program verify, and VSI, which are selected by active signals PCTRERS, PCTRPGM, PCTRERV, PCTRPGV, and PCTRVSI, respectively.

Output TCOUNT is active for only one state because counter 48 continues to increment TCOUNT 418. To store the active terminal count TCOUNT 418 latch 412 is used in conjunction with OR gate 413.

Latch 412 is reset by RESET 206 when write state machine 32 is first powered up, setting its Q output 420 to a logic 0. Latch 412 is also reset when the PCTRST 414 signal is asserted. When TCOUNT 418 goes active high, Q output 420 goes to a logic 1. Q output 420 keeps the latch's input at logic 1 after TCOUNT 418 goes inactive, thus keeping PCTRTC 220 at a logic 1 until latch 412 is reset by RESET 206.

FIG. 18 illustrates in block diagram form event counter 182. Event counter 182 includes event counter SBUS decoder 422, a thirteen bit counter 424, an event counter terminal count select circuit 426, a latch 428, and an OR gate 430.

Event counter SBUS decoder 422 controls counter 424 and terminal count match circuit 426. Decoder 422 decodes SBUS signals 208 and determines whether counter 424 should be enabled or reset, and selects between the two possible event counter terminal counts.

The operation SBUS decoder 422 for each WSM state can be determined with reference to FIGS. 10, 12, and 14. For example, FIG. 12 indicates that in VERIFY state 338 SBUS decoder 422 selects the erase terminal count by setting ECTRERS.

Event counter SBUS decoder 422 is implemented as random logic in the preferred embodiment.

Counter 424 is reset by SBUS decoder 422 whenever WSM 32 begins to program, precondition or erase a new byte. The ripple carry counter 424 increments its count only when enabled by an active ECTREN signal 432. The Q outputs 434 of counter 424 are fed to event counter terminal count match circuit 426.

Event counter terminal count match circuit 426 analyzes Q outputs 434 and indicates when a selected terminal count is reached. Event counter terminal count match circuit 426 recognizes two possible terminal counts: namely, erase and program, which are selected by the signals ECTRERS and ECTRPGM.

Event counter 182 allows over 8000 erase pulses to be applied when an erase event is selected and 50 program, precondition, and postcondition pulses to be applied.

TCOUNT 436 is latched in exactly the same fashion as TCOUNT 418 using latch 428 and OR gate 430.

FIG. 19 illustrates in block diagram form address counter 186. Within write state machine 32, address counter 186 functions as both an input buffer and a counter. Address counter 186 includes TTL input buffers 440 and 442, bypass multiplexers 444 and 446, a column counter 448, a row counter 450, and SBUS decoder 452.

TTL input buffers 440 and 442 convert the TTL levels of A(15:0) 44 to CMOS levels. The buffer outputs, AIN(15:0), are applied to the A inputs of bypass multiplexers 444 and 446. Address counter 186 provides flow through addressing when READY 204 is a logic 1, which selects the A inputs of multiplexers 444 and 446 to be output as AX(9:0) 72 and AY(5:0) 70.

Together row counter 450 and column counter 448 generate a unique address for each byte of a block of memory array 36. Each block is organized as 512 columns by 1024 rows. Thus, column counter 448 brings its terminal count active at a count of 63 because a byte, or eight columns, is addressed at a time. The column counter's terminal count output is coupled to controllers 240, 242, 244, 246, and 248 as the address counter terminal count signal, ACTRTC 226. Analogously, row counter 450 brings its terminal count active at a count of 1023.

Counters 448 and 450 must also generate unique addresses for the four rows included in redundant rows 80 during preconditioning. Thus, during preconditioning, there are 1028 rows, rather than 1024 rows. Address counter 186 must recognize, therefore, two different row terminal counts: one at 1023 and the other at 1027. Address counter 186 recognizes two row terminal counts using AND gates 454 and 456, NOR gate 458, XNOR gate 460, and latch 462. The first row terminal count signal, TC1 464, goes active when row counter 450 reaches 1023. During preconditioning TC1 464 remains high while all four of the redundant rows 80 are counted through. For this reason, TC1 464 is also used as the redundant bit, REDBIT 464, by Y Decoder 76. The second row terminal count signal, TC2 466, is generated from TC1 464, two row counter outputs, AQ0 and AQ1, and redundant bit enable REDBITEN 468. Thus, TC2 goes active only during preconditioning and only four clock cycles after TC1 goes active.

XTC, generated from TC1 464 and TC2 466, is used to enable column counter 448. Multiplexer 470 selects between TC1 464 and TC2 466 using TCSelect 472. When it is a logic 1, TCSelect 472 couples TC1 464 to mux output XTC 474. TCSelect 472 is a logic 1 during programming and erasure. Conversely, TCSelect 472 is a logic 0 during preconditioning and postconditioning. During these algorithms TC2 466 is coupled to mux output XTC 474.

TCSelect 472 is an output of Select Logic 471. Select logic 471 generates TCSelect 472 using PRECEN and EREN. Select Logic 471 is implemented as random logic in the preferred embodiment.

Row counter 450 and column counter 448 are both linear counters with parallel load and will not be described in detail.

The operation of counters 448 and 450 is controlled by SBUS decoder 458, and address latch enable ALE 224. The outputs of buffers 440 and 442, AIN(5:0), are loaded into counters 448 when ALE 224 goes active. Address latch enable signal, ALE 224, is generated by command state machine 60 and goes active at the start of each program command.

Two SBUS decode signals, ACRST and ACTREN, control the resetting and enabling of counters 448 and 450. SBUS decoder 452 also generates the redundant bit enable, REDBITEN.

The operation of SBUS decoder 452 during program, precondition and erase can be understood with reference to FIGS. 8, 10, 12, and 14. For example, ACTREN is a logic 1 in Increment Address state 316 of the preconditioning algorithm.

SBUS decoder 452 is implemented as random logic in a preferred embodiment.

FIG. 20 illustrates a portion 500 of CAMS 82 and Y Decoder 76. Portion 500 is used during preconditioning to perform two functions. First, portion 500 prevents CAMS 82 from replacing shorted rows with redundant rows. Second, portion 500 informs write state machine 32 during preconditioning that a shorted address has been addressed. Redundant row enable signals RREN(4:1) 502 are used to perform both functions.

RREN(4:1) 502 are generated by CAM registers 504, only one of which is shown in FIG. 20.

CAM register 504 stores the address of one defective row within memory array 36. Each CAM register 504 compares address signals AX(9:0) 72 and AY(5:0) 70 to the address that it stores. When a match occurs CAM register 42 activates one of redundant rows 80 via one of the four redundant row enable signals, RREN(4:1) 502.

CAM register 504 performs its function using a number of comparators 506. Each comparator 506 compares one address bit, AX(9:0) 72 or AY(5:0) 70, to the value stored by a CAM bit 508. Exclusive NOR gate XNOR 510 performs the comparison, outputting a logic 1 when the address bit and CAM bit 508 agree. The outputs 512 from each comparator 506 are ANDed together by AND gate 514. When each comparator 506 indicates a match, AND gate 514 brings its output active high, thereby activating its associated redundant row.

RREN(4:1) 502 are ORed together by gate 516 to generate redundant row signal RR 518. RR 518 goes to a logic 1 whenever a redundant row is enabled. RR 518 is combined with the precondition enable signal, PRECEN 260, to generate TWO ROW 236. As a result, TWOROW is active only during preconditioning and only when a shorted row is addressed.

Redundant row enable signals 502 are converted to 16 bit addresses by address translation table 520. Address translation table 520 outputs a 16 bit address, CRR(16:0) 522, for the selected redundant row. During programming and erasing, CRR(16:0) 522 flows through multiplexer 524 to be output as the array address signal, AA(16:0) 526. AA(16:0) 526 are applied to memory array 36. During preconditioning, however, CRR(16:0) 522 is not output as array address signals 526. NOSWAP 528 selects address counter signals AQ(15:0) and REDBIT as array address signals 526 during preconditioning.

SBUS Decoder 530 generates PRECEN 260 and NOSWAP 528. Both signals are active throughout preconditioning and inactive otherwise. In a preferred embodiment, SBUS decoder 530 is implemented as random logic.

FIG. 21 illustrates in block diagram form one instance of Reference Cell Selection Circuitry 194 and its relationship to main array 36 and sense amplifiers 78. Eight instances of circuitry 194 are needed to verify eight cells of array 36 at one time. Reference cell selection circuitry 194 allows controllers 242, 244, 246, and 248 to select one of two possible reference cells. Precondition controller 244 uses both types of cells, according to whether a shorted row is currently addressed. During preconditioning, when good rows are addressed circuitry 194 couples a reference cell with a normal threshold voltage. But when shorted rows are addressed, circuitry 194 couples to sense amplifiers 78 shorted reference cells, which have threshold voltages below the normal threshold voltage but sufficient to prevent quick overerasure of shorted rows during erasure. Both erase controller 246 and program controller 240 use only one type of reference cell. Program controller 240 uses the reference cell with a threshold voltage of 5 volts, while erase controller 246 uses the reference cell with a threshold voltage of approximately 3 volts.

Reference cell selection circuity 194 includes SBUS decoders 550 and 552, VPX select circuitry 554, shorted reference cell 556, normal reference cell 558 and transistors 560 and 562.

Reference cells 556 and 558 are flash memory cells. The difference between the two is the level of their threshold voltages. Shorted reference cell 556 has a threshold voltage level of approximately 3.1 volts. This is high enough to prevent the quick overerasure of shorted memory cells, but is a much easier level to reach than 5.3 volt level to which good cells are preconditioned. The voltage level of shorted reference cell 556 is suitable for erase verification also. For this reason cell 556 is also called erase verify reference cell 556. Normal reference cell 558 has a threshold voltage of approximately 5.3 volts. This threshold voltage is appropriate for programming also. Thus, cell 558 is also referred to as program verify reference cell 558.

SBUS decoder 552 selects between shorted reference cell 556 and normal reference 558 in conjunction with VPX select circuitry 554. Circuitry 554 determines the voltage level of VPX 564, one of the inputs to SBUS decoder 552. During preconditioning when TWOROW 236 is active, VPX 564 is set to a voltage level appropriate for the gate of shorted reference cell 556. That is, VPX 564 is set high enough to read reference cell 556 but low enough to prevent reference cell 556 from being slowly programmed over time and inadvertently changing the cells threshold voltage. In a preferred embodiment, VPX 564 is set to approximately 5 volts during preconditioning when TWOROW 236 is active. VPX 564 is also set to 5 volts during erase verification. During the preconditioning of good cells; i.e. when TWOROW 236 is inactive, VPX 564 is set high enough to read reference cell 558 but low enough to prevent reference cell from being slowly programmed while being read. In a preferred embodiment, VPX 564 is set to approximately 7 volts. VPX 564 is also set to 7 volts during program verification.

The operation of VPX Select circuitry 554 is summarized by Table 2.

TABLE 2

| Operation of VPX Select Circuitry 554 | | |
|---|---|---|
| Inputs | | Outputs |
| PrecEn | TwoRow | VPX |
| logic 1 | logic 0 | 7 v |
| logic 1 | logic 1 | 5 v |

SBUS decoder 552 selects between reference cells 556 and 558 using VPX 564 and TWOROW 236. SBUS decoder 552 performs its function via its outputs, EVGATE and PVGATE, which turn reference cells 556 and 558 on and off. During preconditioning while a shorted row is being preconditioned, SBUS decoder 552 sets EVGATE to 5 volts and PVGATE to 0 volts. In other words, SBUS decoder 552 turns reference cell 556 and reference cell 558 off. SBUS decoder 552 also sets EVGATE and PVGATE to these same levels during erase verification. When precondition verifying a good row, SBUS decoder 552 sets EVGATE to 0 volts and PVGATE to 7 volts. This turns reference cell 556 off and reference cell 558 on. SBUS decoder outputs the same levels during program verify.

The operation of SBUS decoder 552 during preconditioning is summarized by Table 3.

TABLE 3

| Operation of SBUS Decoder 552 | | | |
|---|---|---|---|
| Inputs | | Outputs | |
| VPX | TWOROW | EXGATE | PVGATE |
| 7 v | logic 0 | 0 v | 7 v |
| 5 v | logic 1 | 5 v | 0 v |

SBUS decoder 550 couples reference cells 556 and 558 to the reference input of sense amplifier 570. SBUS decoder 550 performs this task via transistors 560 and 562. Each transistor 560 and 562 couples a reference cell 556 and 558 to sense amplifier 570 when turned on. SBUS decoder 550 turns transistors 560 and 562 with its outputs, SHORTON 572 and NORMALON 574. During preconditioning SBUS decoder 550 brings SHORTON 572 to 5 volts, coupling reference cell 556 to sense amplifier 570 when a shorted row is addressed. SHORTON 572 is also set to 5 volts during erase verify. Conversely, during the precondition verify of normal rows NORMALON is set to 5 volts and SHORTON to 0 volts. This couples normal reference cell 558 to the reference input of sense amplifier 570.

Table 4 also summarizes the operation of SBUS decoder 550 during preconditioning.

TABLE 4

| Operation of SBUS Decoder 550 | | | |
|---|---|---|---|
| Inputs | | Outputs | |
| VPY | TWOROW | SHORTON | NORMALON |
| 5 v | logic 0 | 0 v | 5 v |
| 5 v | logic 1 | 5 v | 0 v |

SBUS decoders 550 and 552 must be modified slightly from their description in Tables 2, 3, and 4 to perform as desired during the erase and program algorithms. Those modifications should be obvious, given the previous description of these algorithms and the operation of circuitry 194 during preconditioning.

FIG. 23 illustrates in block diagram form data latch and comparator circuit ("DLC") 190. DLC 190 includes eight latch and comparator circuits 700a–700h, one for each data bit, DLC SBUS decoders 702, 704, and 706, an AND gate 708, a multiplexer 710, and a latch 712.

Microprocessor 999 writes commands to flash memory 30 via data lines DATA(7:0) 46, while holding CEB 48 and WEB 50 active. Active CEB 48 and active WEB 50 enable TTL input buffers 714a–714h within each DLC latch and comparator circuit 700a–700h converting the data on lines 46 to CMOS signals DATAIN(7:0) 47.

CSM 60 brings data latch enable signal DLE 716 active if DATAIN(7:0) 47 represents a program or an erase command. When DLE 716 becomes active, the data from TTL buffers 714a–714h is clocked into latches 718a–718h. During program verification the latch and comparator circuits 700a–700h operate as follows. ERASE signal 202 is inactive, selecting the I/O inputs of multiplexers 720a–720h as the multiplexers' outputs. Thus, the data stored in latches 718a–718h is applied to the LAT inputs of comparators 722a–722h.

Comparator outputs MATCH(7:0) 232 indicate whether each bit of the program data matches sense amp outputs SOUT(7:0) 228. For each comparator 722a–722h, if the two comparator inputs SOUT and LAT agree, the comparator output will be a logic one.

If the comparator inputs do not agree, the output will be a logic 0.

During program verification, the operation of the comparators 722a–722h described above is modified by the active program verify signal PGVER 724. As can be seen in Table 5, when PGVER 724 is active, comparators 722a–722h output a logic 1 when the cell is at a logic 0 and the bit is desired to be a logic 1. The comparators 722a–722h indicate a match in this situation because the write state machine 32 cannot erase a programmed bit during a program operation.

TABLE 5

| | | MATCH OUTPUT | |
|---|---|---|---|
| SOUT | LAT | PGVER INACTIVE | PGVER ACTIVE |
| 0 | 0 | 1 | 1 |
| 0 | 1 | 0 | 1 |
| 1 | 0 | 0 | 0 |
| 1 | 1 | 1 | 1 |

MATCH(7:0) 232 are ANDed together by AND gate 708. The output of AND gate 708, WMATCH 230, is a logic 1 when each bit of SOUT(7:0) 228 and DATAIN(7:0) 47 match and a logic 0 when SOUT(7:0) 228 and DATAIN(7:0) 47 do not match.

The AND gate 708 output is applied to the I1 input of the output multiplexer 710. The I1 input of multiplexer 710 is selected as the multiplexer output by an active CMPEN signal 726.

CMPEN 726 is active during program verification, thus allowing the AND gate output 708 to flow through latch 728 and control the logic state of WMATCH signal 230.

WMATCH 230 is stored by latch 728 when program controller 240 moves out of Verify Delay 370. The Q output of latch 728 is fed back to the I0 input of multiplexer 710. When CMPEN 726 becomes inactive, the I0 input of multiplexer 710 is selected allowing it to control latch 728.

WMATCH 230 is reset by RESET 206.

The operation of the data latch and comparator circuits 700a–700h during other verification operations is similar to that described above for program verification, with the following exceptions. First, I1 inputs of multiplexers 720a–720h are set to a logic 1 by REFDAT 730 during erase verification, and to a logic 0 during precondition and postcondition verification. This establishes a voltage reference with which to compare the sense amp outputs SOUT(7:0) 228. Second, active ERASE 208 selects I1 inputs of multiplexers 720a–720h to be output to comparators 722a–722h. Third, PGVER 724 is inactive, which permits comparators 722a–722h to operate without modification.

The DLC SBUS decoders 730, 724 and 726 help control the operation of data latch and comparator circuits 700a–700h. The operation of DLC SBUS decoders 282, 284 and 286 can be determined with reference to FIGS. 8, 10, and 12. For example, FIG. 12 indicates that in verify state 338 state DLC SBUS decoder 706 sets CMPEN 726 high.

In a preferred embodiment, DLC SBUS decoders 720, 704, and 706 are implemented in random logic.

FIG. 24 illustrates in block diagram form status register 188. Status register 188 includes a clock generator 740; three output latches 742a–742h, status register SBUS decoders 744 and 746, latches 748 and 750, OR gates 752 and 754, and inverter 756.

Status register outputs 758, 760, and 762 are synchronized to output enable bar signal OEB 52. Clock generator 740 synchronizes these signals by generating a set of clock pulses PH'1/PH'2 764 whenever OEB 52 toggles. Clock pulses PH'1/PH'2 764 control the clocking of data into output latches 742a–742c. Thus, it will be understood that OEB 52 must be toggled in order to read valid data from output latches 742a–742c.

Status register SBUS decoder 744 decodes SBUS(6:0) 208 to detect program failures. When SBUS decoder 744 detects a failure, PRGFAIL 745 is set to a logic 1. Because SBUS(6:0) 208 indicates a program failure for only one state, active PRGFAIL 745 is stored using latch 748 and OR gate 750, until microprocessor 999 chooses to resets status register 188. Status register 188 is reset by bringing STATRS 766 active. Devices 750 and 754 operate in the same manner as a substantially similar pair of devices in period counter 184.

Status register SBUS decoder 746 decodes SBUS(6:0) 208 to detect erase failures. When SBUS decoder 746 detects a failure ERSFAIL signal 747 is set high. Because SBUS(6:0) 208 indicates an erase failure for only one state period, active ERSFAIL signal 747 is stored using latch 750 and OR gate 754 until microprocessor 999 chooses to reset status register 188. Devices 750 and 754 operate in the same manner as a substantially similar pair of devices in period counter 184.

FIG. 12 describes the operation of status register SBUS decoders 744 and 746. For example, FIG. 12 indicates that ERSFAIL 747 is set for Fail state 348.

In a preferred embodiment, both status register SBUS decoders 744 and 46 are implemented in random logic.

The active outputs of latches 748 and 750 are reset when status register reset signal STATRS 766 is active high, which occurs as the result of the CLEAR STATUS REGISTER command from microprocessor 999.

RDY/BSY 758 is a logic zero write state machine 32 is busy. A logic one on RDY/BSY 758 indicates that write state machine 32 has completed its operation and is prepared to perform another operation and that the other status outputs are valid.

ERASE_FAIL 762 is set to a logic 1 if WSM 32 cannot successfully erase or postcondition array 36. ERASE_FAIL signal is set by WSM 32 and cleared by the STATUS REGISTER CLEAR command.

PRG_FAIL 760 is set to a logic one if WSM 32 cannot successfully program a byte. PRG_FAIL 760 is also set to a logic 1 if an erase command is botched or a hardware error is encountered. PRG_FAIL 760 is set by SBUS signals 208 and cleared by the STATUS REGISTER CLEAR command.

Thus, a method of preconditioning and verifying the preconditioning of memory cells within shorted rows of a memory array has been described. First, a preconditioning pulse is applied to two memory cells shorted together. Afterward, one of the two cells shorted together is read by applying a nominal gate voltage level to the gates of the two memory cells shorted together. At the same time, a shorted reference cell is read by applying a voltage level to its gate which is less than the nominal gate voltage level. While the read voltages are being applied to the array cells and the shorted reference cell, the threshold voltage of one of the two shorted array cells is compared to the threshold voltage of the shorted reference cell. The shorted reference cell has a threshold voltage level that is lower than the level normally required for preconditioning but which is sufficient to prevent the quick overerasure of the shorted memory cells.

Circuitry for verifying the preconditioning of shorted cells within a flash memory cell has also been described. The circuitry includes a sense amplifier for comparing the threshold voltage of a memory cell within the memory array to a selected reference threshold voltage level. Selection circuitry couples two different reference cells to the sense amplifier, each having a different threshold voltage level. One of the reference cells has a nominal threshold voltage level. The other reference cell, a shorted reference cell, has a threshold voltage less than the nominal threshold voltage, but sufficient to prevent the quick overerasure of array cells during erasure. The selection circuitry selects the nominal reference cell when the memory cell is not shorted to another memory cell. When the array cell is shorted to another cell within the array, the selection circuitry selects the shorted reference cell.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of preconditioning a shorted memory cell in a nonvolatile semiconductor memory array including a multiplicity of normal memory cells, each memory cell having a threshold voltage, preconditioning raising the threshold voltage of the shorted memory cell to a level sufficient to prevent its leaking current during erase verification of normal memory cells, the method comprising the steps of:
   a) applying a precondition pulse to the shorted memory cell;
   b) comparing the threshold voltage of the shorted memory cell to a shorted cell precondition reference voltage level, the shorted cell precondition reference voltage level being lower than a normal cell precondition reference voltage level above which the threshold voltage of normal memory cells are raised by preconditioning; and
   c) repeating steps a) through b) until the threshold voltage level of the shorted memory cell is greater than the shorted cell precondition reference voltage level.

2. A method of preconditioning and verifying the preconditioning of a first memory cell shorted to a second memory cell in a nonvolatile semiconductor memory array including a multiplicity of normal memory cells, each memory cell having a threshold voltage and a gate, preconditioning raising the threshold voltage of the first memory cell and the second memory cell to a level sufficient to prevent their leaking current during erase verification of normal memory cells, the method comprising the steps of:
   a) applying a first preconditioning pulse to the first memory cell and the second memory cell in parallel;
   b) reading the first memory cell by applying a first gate voltage level to the gates of the first memory cell and the second memory cell;
   c) reading a shorted reference cell having a gate and a shorted cell precondition reference voltage level by applying a second gate voltage level to the gate of the shorted reference cell, the second gate voltage level being less than the first gate voltage level, the shorted cell precondition reference voltage being lower than a normal cell precondition reference voltage above which the threshold voltages of normal memory cells are raised by preconditioning;
   d) comparing the threshold voltage of the first memory cell to the shorted cell precondition reference voltage to determine whether the threshold voltage of the first memory cell is greater than the shorted cell precondition reference voltage; and
   e) repeating steps a) through d) until the threshold voltages of the first memory cell and the second memory cell are greater than the shorted cell precondition reference voltage.

3. The method of claim 2 wherein the second gate voltage level is low enough to prevent gradual programming of the shorted reference cell.

* * * * *

UNITED STATES PATENT AND TRADEMARK OFFICE
CERTIFICATE OF CORRECTION

PATENT NO.   :   5,347,489
DATED        :   September 13, 1994
INVENTOR(S)  :   Merchant et al.

It is certified that error appears in the above-identified patent and that said Letters Patent is hereby corrected as shown below:

In the title page, in the first line of section [75], change the domicile of Amit Merchant from "Cirtrus Heights" to --Portland, Oregon--

In column 11 at line 28 delete " 42" and insert --242--

In column 11 at line 31 delete "PRG_FA1L and ERASE_FA1L" and insert --PRG_FAIL and ERASE_FAIL--

In column 17 at line 56 delete "FA1L" and insert --FAIL--

In column 17 at line 58 delete "FA1L" and insert --FAIL--

Signed and Sealed this

Seventh Day of January, 1997

Attest:

BRUCE LEHMAN

*Attesting Officer*   *Commissioner of Patents and Trademarks*